(12) United States Patent
Su et al.

(10) Patent No.: US 9,876,005 B2
(45) Date of Patent: Jan. 23, 2018

(54) SCRS WITH CHECKER BOARD LAYOUTS

(71) Applicant: Taiwan Semiconductor Manufacturing Company, Ltd., Hsin-Chu (TW)

(72) Inventors: Yu-Ti Su, Tainan (TW); Han-Jen Yang, Taipei (TW); Wun-Jie Lin, Hsin-Chu (TW); Li-Wei Chu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/171,812

(22) Filed: Jun. 2, 2016

(65) Prior Publication Data

US 2017/0098645 A1    Apr. 6, 2017

Related U.S. Application Data

(60) Provisional application No. 62/236,002, filed on Oct. 1, 2015.

(51) Int. Cl.
| | |
|---|---|
| *H01L 27/02* | (2006.01) |
| *H01L 21/06* | (2006.01) |
| *H01L 29/06* | (2006.01) |
| *H01L 29/10* | (2006.01) |
| *H01L 29/861* | (2006.01) |

(52) U.S. Cl.
CPC ...... *H01L 27/0262* (2013.01); *H01L 27/0207* (2013.01); *H01L 27/0255* (2013.01); *H01L 29/0692* (2013.01); *H01L 29/1095* (2013.01); *H01L 29/861* (2013.01)

(58) Field of Classification Search
None
See application file for complete search history.

(56) References Cited

U.S. PATENT DOCUMENTS

| | | | |
|---|---|---|---|
| 6,521,952 B1 | 2/2003 | Ker et al. | |
| 9,147,676 B2* | 9/2015 | Su | H01L 27/0248 |
| 2006/0164130 A1* | 7/2006 | Yoshida | H01L 27/0207 |
| | | | 327/85 |
| 2012/0319164 A1* | 12/2012 | Inaba | H01L 29/66393 |
| | | | 257/173 |
| 2015/0091054 A1 | 4/2015 | Su et al. | |
| 2015/0380396 A1* | 12/2015 | Su | H01L 27/0248 |
| | | | 257/140 |

OTHER PUBLICATIONS

Morishita, Y. et al.: "An Investigation of Input Portection for CDM Robustness in 40nm CMOS Technology," 2009 31st EOS/ESD Symposium, Aug. 30- Sep. 4, 2009, pp. 1-6, Anaheim, CA.

* cited by examiner

*Primary Examiner* — Daniel Whalen
(74) *Attorney, Agent, or Firm* — Slater Matsil, LLP

(57) ABSTRACT

An Electro-Static Discharge (ESD) protection circuit includes a plurality of groups of p-type heavily doped semiconductor strips (p+ strips) and a plurality of groups of n-type heavily doped semiconductor strips (n+ strips) forming an array having a plurality of rows and columns. In each of the rows and the columns, the plurality of groups of p+ strips and the plurality of groups of n+ strips are allocated in an alternating layout. The ESD protection circuit further includes a plurality of gate stacks, each including a first edge aligned to an edge of a group in the plurality of groups of p+ strips, and a second edge aligned to an edge of a group in the plurality of groups of n+ strips.

20 Claims, 33 Drawing Sheets

| Diode Number | Example Operating Voltage |
|---|---|
| 2-3 | 0.9V |
| 4-5 | 1.8V |
| 6-8 | 2.5V |
| 9-11 | 3.3V |
| 13-14 | 5V |
| >14 | >5V |

Figure 13

SCRS WITH CHECKER BOARD LAYOUTS

PRIORITY CLAIM AND CROSS-REFERENCE

This application claims the benefit of U.S. Provisional Application No. 62/236,002, filed on Oct. 1, 2015, entitled "SCRs with Checker Board Layouts", which application is hereby incorporated herein by reference in its entirety.

BACKGROUND

Silicon-Controlled Rectifier (SCR) devices have excellent Electro-Static Discharge (ESD) immunity and are good candidates for low-capacitance applications, which include Radio Frequency (RF) and high speed devices. Conventional SCRs, however, have low turn-on speed and high trigger voltages, and hence are not suitable for operations that need high turn-on speed and low trigger voltages.

BRIEF DESCRIPTION OF THE DRAWINGS

For a more complete understanding of the embodiments, and the advantages thereof, reference is now made to the following descriptions taken in conjunction with the accompanying drawings, in which:

FIG. 13 illustrates a table showing the relationship between the example operating voltages of SCR/diode-string units and the number of diodes in the diode string of the respective SCR/diode-string units in accordance with some embodiments;

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Electro-Static Discharge (ESD) protection devices comprising Silicon-Controlled Rectifiers (SCR) and diode strings are provided in accordance with various exemplary embodiments. The variations of the ESD protection devices in accordance with some embodiments are discussed. Throughout the various views and illustrative embodiments, like reference numbers are used to designate like elements.

Figure 1A:
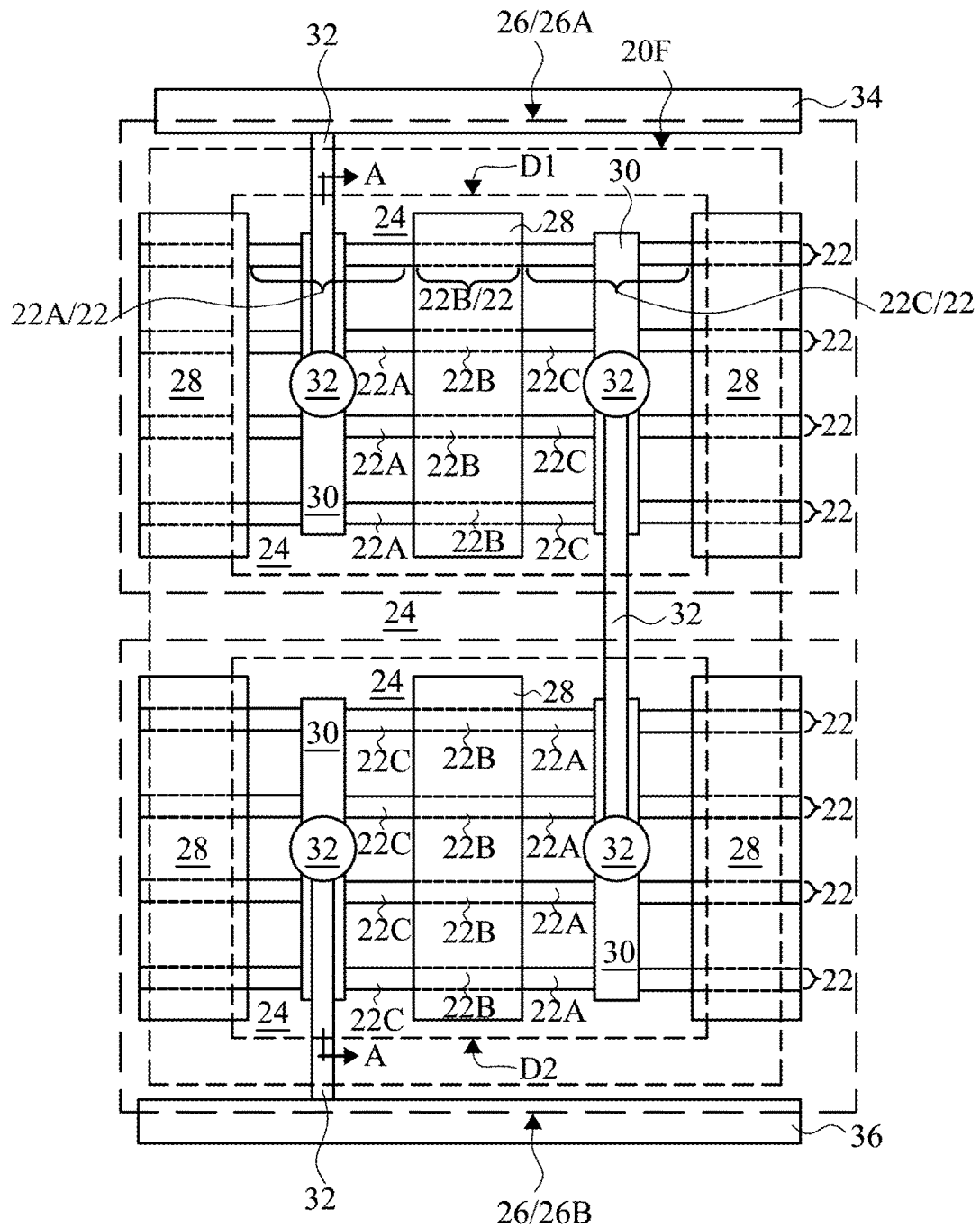
FIG. 1A illustrates a top view of a Silicon-Controlled Rectifier (SCR) and diode string unit (referred to as SCR/diode-string unit hereinafter) in accordance with some embodiments, wherein two diodes are connected serially to form the diode string.
Figure 2:
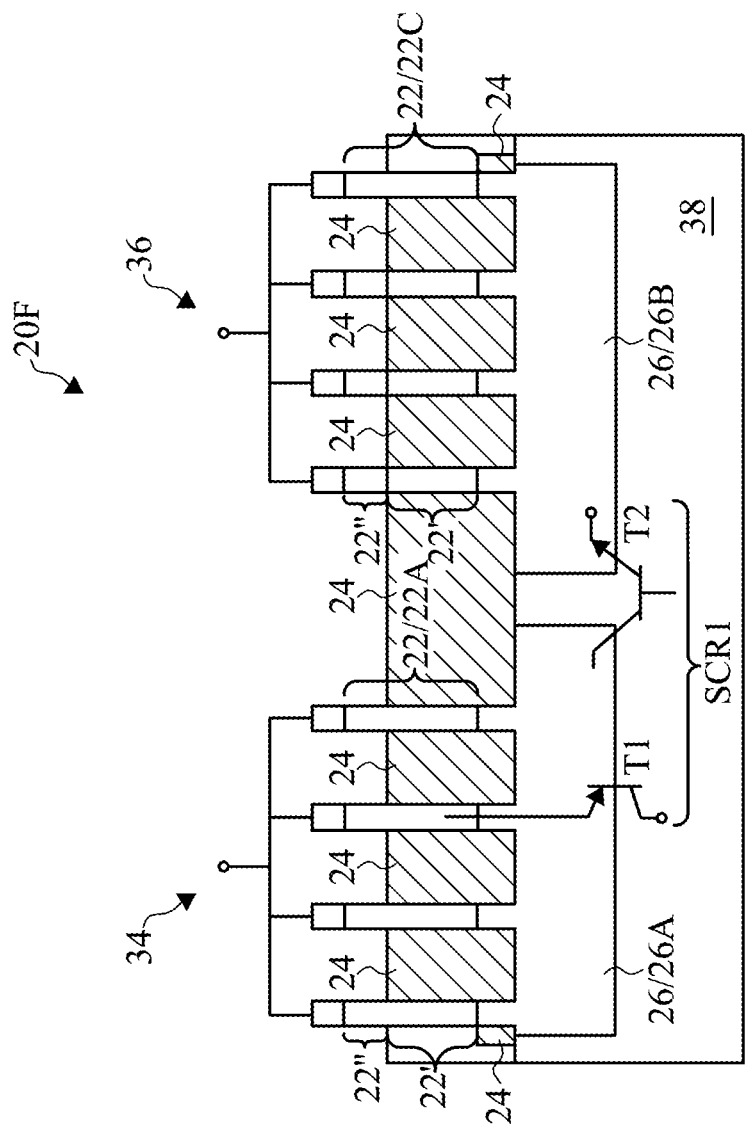
FIG. 2 illustrates a cross-sectional view of the SCR/diode-string unit in FIG. 1A in a plane containing A-A line in accordance with some embodiments.

FIG. 1A illustrates a top view of a unit (referred to as an SCR/diode-string unit hereinafter) that includes an SCR and a diode string therein. SCR/diode-string unit 20F includes a plurality of semiconductor strips 22, which are surrounded by Shallow Trench Isolation (STI) region(s) 24. Referring to FIG. 2, semiconductor strips 22 include portions 22' between STI regions 24, and may, or may not, include semiconductor fins 22'' that are over the top surfaces of STI regions 24. In FIG. 1A, STI regions 24 are provided for the purpose of illustration. In other embodiments, any suitable isolation structures that are configured to electrically isolate semiconductor strips 22 from each other may be used instead of STI regions 24.

Referring back to FIG. 1A, the plurality of semiconductor strips 22 have lengthwise directions parallel to each other. The neighboring semiconductor strips 22 may have a uniform pitch. A plurality of gate stacks 28 are formed over semiconductor strips 22, and may be formed to contact the sidewalls and the top surfaces of semiconductor strips 22. Each of gate stacks 28 includes a gate dielectric layer and a gate electrode (not shown).

Well regions 26 (including 26A and 26B) are formed, and portions 22B of semiconductor strips 22, which portions 22B are covered by gate stacks 28, may also be portions of well regions 26. In some embodiments, well regions 26 are n-well regions, which may have an n-type impurity concentration between about $1E16/cm^3$ and about $1E19/cm^3$, for example. Accordingly, the portions 22B of semiconductor strips 22 are of n-type. Semiconductor strips 22 include heavily doped p-type (p+) regions 22A and heavily doped n-type (n+) regions 22C, which have a p-type impurity concentration and an n-type impurity concentration, respectively, between about $1E19/cm^3$ and about $5E21/cm^3$, for example.

Semiconductor strips 22 form diodes D1 and D2. Each of diodes D1 and D2 has p-type semiconductor strip portions 22A as the anode, and n-type semiconductor strip portions 22B and 22C as the cathode. The anode and the cathode of diode D1 is on the top left part and top right part of SCR/diode-string unit 20F. The anode and the cathode of diode D2 is on the bottom right part and bottom left part of SCR/diode-string unit 20F. Accordingly, the p+ regions 22A and n+ regions 22C are allocated in a checker board pattern, wherein the checker board pattern has repeating elemental units allocated in an alternating layout in each row and each column of a checker board.

Metal connections 30, which may be contact plugs, are formed for interconnection. Through metal connections 30, all semiconductor strips 22A in diode D1 are interconnected. All semiconductor strips 22C in diode D1 are interconnected. All semiconductor strips 22A in diode D2 are interconnected. All semiconductor strips 22C in diode D2 are interconnected. Furthermore, semiconductor strips 22C of diode D1 is connected to semiconductor strips 22A in diode D2, for example, through metal connections 32 (such as metal lines, vias, and contact plugs). Accordingly, diodes D1 and D2 form a diode string. The anode 22A of diode D1 may be connected to input/output pad 34 through metal connections 32. The cathode 22C of diode D2 may be connected to Vss node 36 through metal connections 32, which may be an electrical ground. Diodes D1 and D2 are biased in the same direction, with the cathode of each of diodes D1 and D2 closer to Vss node 36 than the respective anode of the same diode. In the illustrated embodiment, diodes D1 and D2 that are connected in the forward direction between pad 34 and Vss node 36.

Figure 1B:
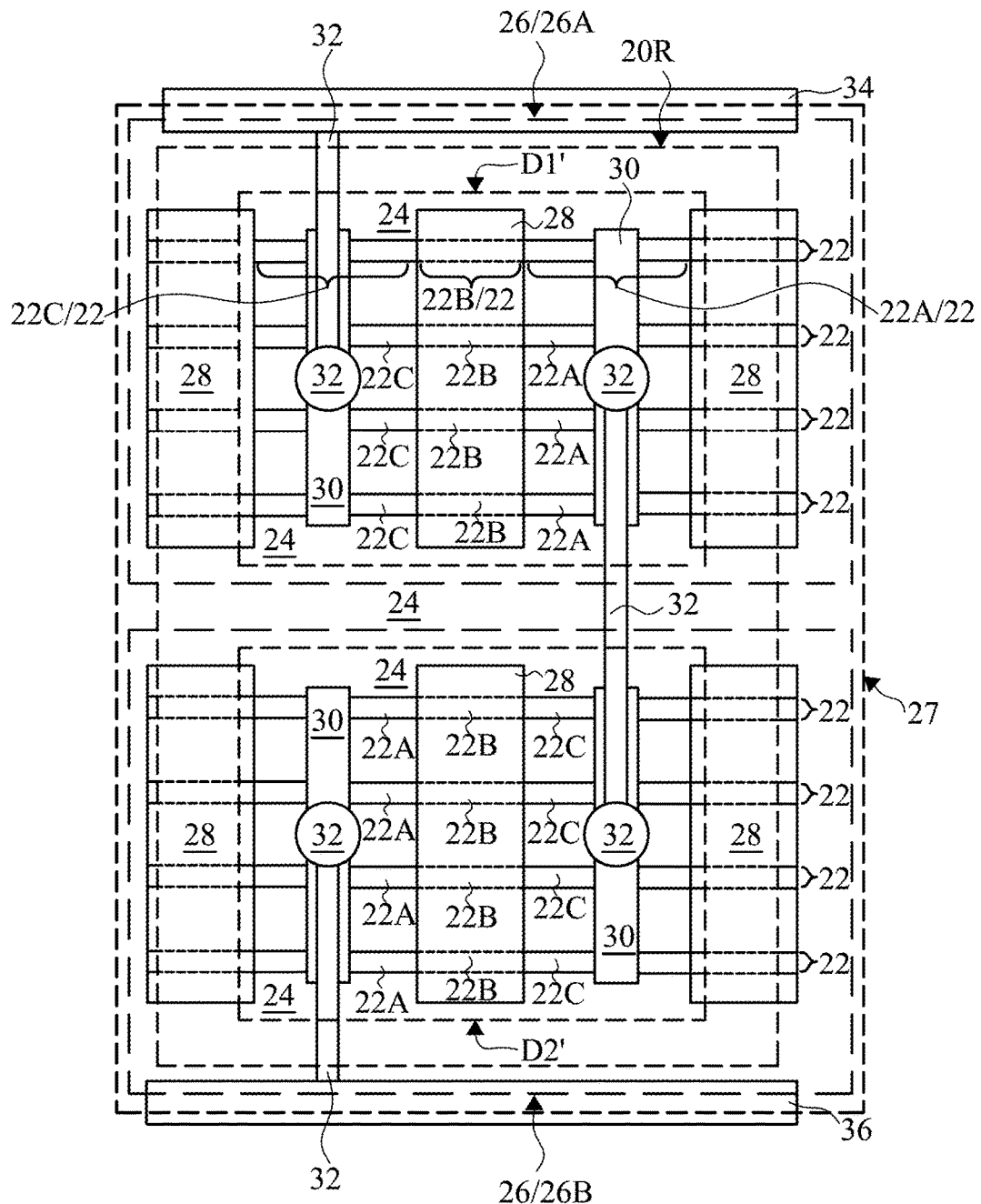
FIG. 1B illustrates a top view of an SCR/diode-string unit in accordance with some embodiments, wherein two diodes are connected serially to form the diode string.

FIG. 1B illustrates a top view of an SCR/diode-string unit 20R in accordance with some embodiments. These embodiments are similar to the embodiments in FIG. 1A, except that semiconductor strips 22 form diodes D1' and D2' that are connected in the reverse direction between pad 34 and Vss node 36. Diodes D1' and D2' are similar to diodes D1 and D2, except p+ regions 22A and n+ regions 22C are swapped. Furthermore, well regions 26 (including 26A and 26B) are p-well regions that are formed within a deep well region 27, which is an n-type well region. In some embodiments, well regions 26 may have a p-type impurity concentration between about $1E16/cm^3$ and about $1E19/cm^3$, and deep well region 27 may have an n-type impurity concentration between about $1E16/cm^3$ and about $1E19/cm^3$.

FIG. 2 illustrates a cross-sectional view of the structure shown in FIG. 1A, wherein the cross-sectional view is obtained from the plane containing A-A line in FIG. 1A. In some embodiments, substrate 38 is a p-type substrate (p-sub). Accordingly, the structure in FIG. 2 form PNP bipolar transistor T1 and NPN bipolar transistor T2. Bipolar transistor T1 includes p+ strips 22A as the emitter, n-well region 26A as the base, and p-sub 38 as the collector. Bipolar transistor T2 has n+ strips 22C and n-well region 26B as the emitter, p-sub 38 as the base, and n-well region 26A as the collector. Bipolar transistors T1 and T2 in combination form an SCR, which is referred to as SCR1 hereinafter. In alternative embodiments, substrate 38 may be an n-type substrate (n-sub), and well regions 26, strips 22A and strips 22B may be doped using impurities of opposite polarities compared to embodiments with p-type substrates. Accordingly, in such embodiments, transistor T1 is NPN bipolar transistor and transistor T2 is PNP bipolar transistor.

Figure 3:
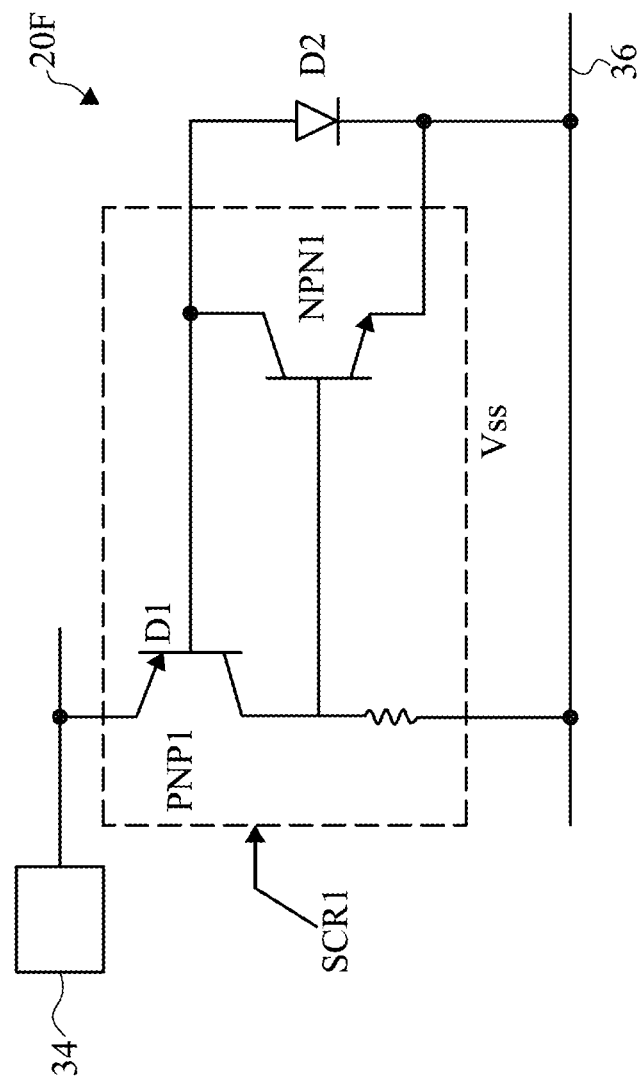
FIG. 3 illustrates a circuit diagram of the SCR/diode-string unit in FIG. 2 in accordance with some embodiments.

FIG. 3 illustrates the circuit diagram of SCR/diode-string unit 20F, wherein diodes D1 and D2 and bipolar transistors PNP1 and NPN1 are illustrated. The SCR1 is triggered by the currents of diode string D1 and D2. SCR/diode-string unit 20F has a high ESD discharging ability due to the high ESD discharging ability of SCR1. On the other hand, diodes D1 and D2 are also coupled between pad 34 and Vss node 36. Accordingly, SCR/diode-string unit 20F has a high turn-on speed due to the high turn-on speed of diodes D1 and D2. The high turn-on speed is advantageous for the ESD protection in Charge Device Mode (CDM).

Figure 4:
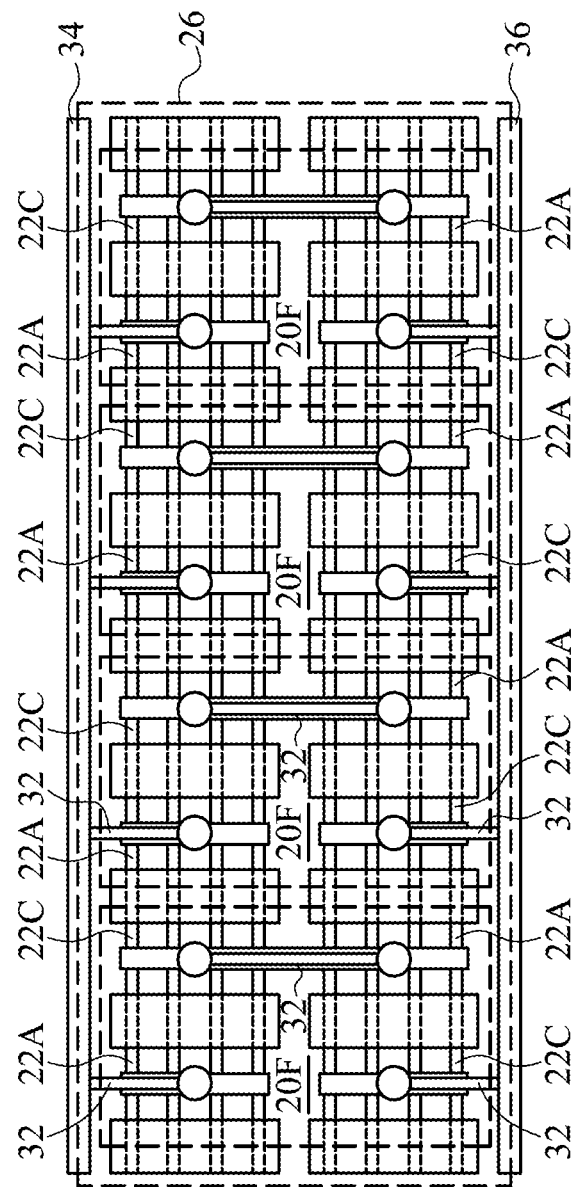
FIG. 4 illustrates a top view of a plurality of SCR/diode-string units connected in parallel in accordance with some embodiments.

FIG. 4 illustrates a top view of an ESD protection device, which includes a plurality of SCR/diode-string units 20F connected in parallel. Each of SCR/diode-string units 20F is connected to pad 34 and Vss node 36. The p+ regions 22A and n+ regions 22C are allocated in a checker board pattern. These embodiments have good ESD discharging ability since the ESD discharging current is multiplied. On the other hand, since the diode string in each of SCR/diode-string units 20F is coupled between pad 34 and Vss node 36, the turn-on speed is high. In the illustrated embodiment, each of SCR/diode-string units 20F are connected in the forward direction between pad 34 and Vss node 36, and the ESD protection device provides protection for positive voltages. In other embodiments, the ESD protection device may provide protection for negative voltages. In such embodiments, SCR/diode-string units 20F are replaced with SCR/diode-string units 20R, which are connected in the reverse direction between pad 34 and Vss node 36.

Figure 5A:
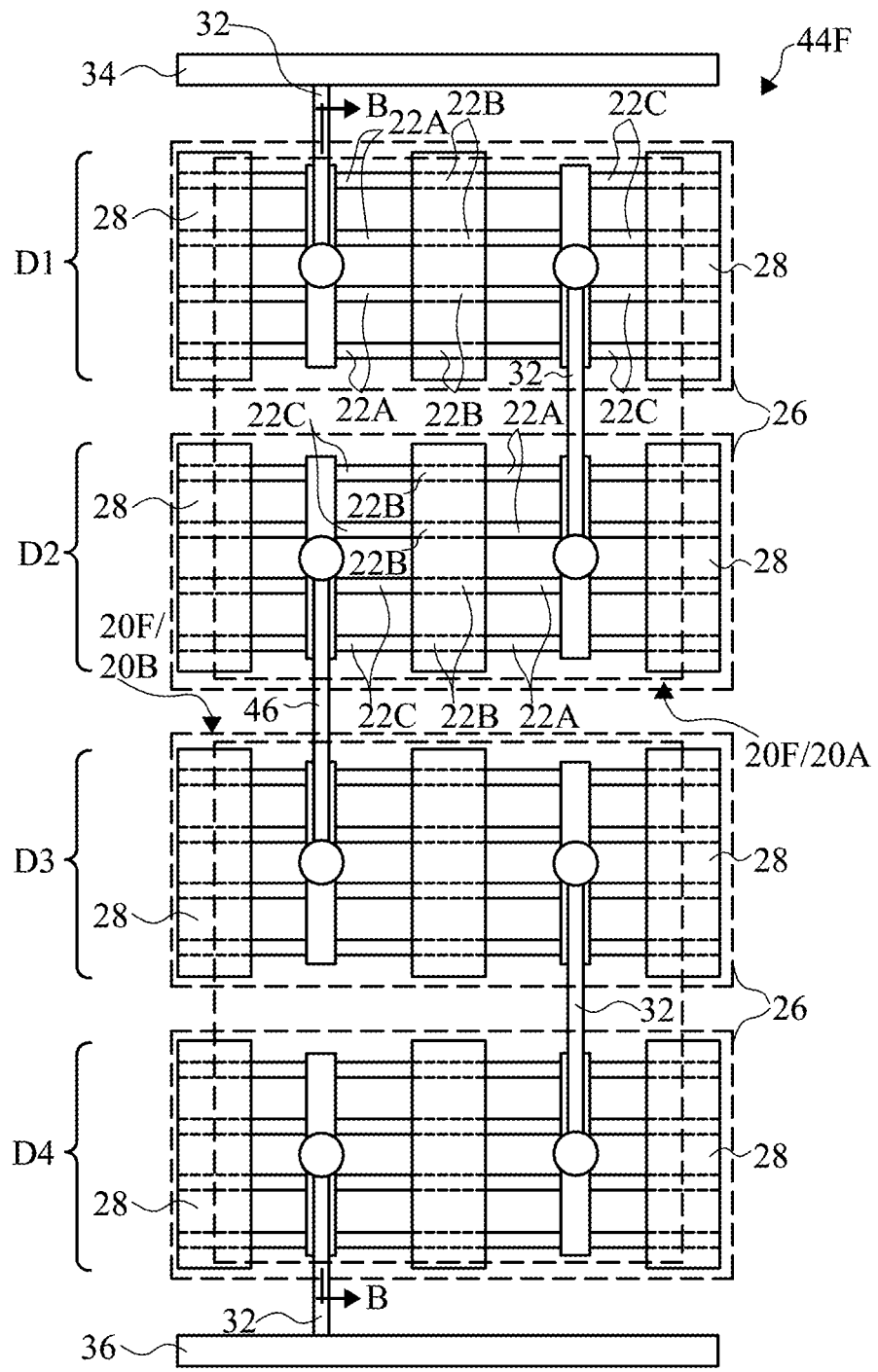
FIG. 5A illustrates a top view of an SCR/diode-string combo unit in accordance with some embodiments, wherein four diodes are connected in series to form a diode string.
Figure 5B:
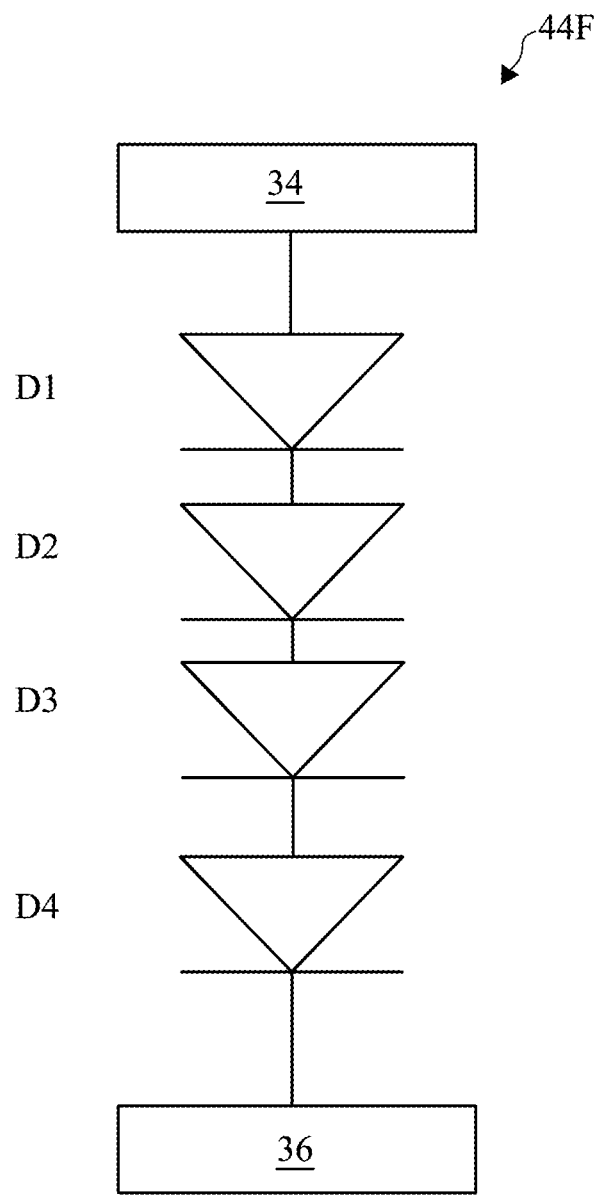
FIG. 5B illustrates a circuit diagram of the SCR/diode-string combo unit in FIG. 5A in accordance with some embodiments.

FIG. 5A illustrates SCR/diode-string combo unit 44F, which includes two SCR/diode-string units 20F (including 20A and 20B having an identical structure) cascaded between input/output pad 34 and Vss node 36. The p+ regions 22A and n+ regions 22C (refer to FIG. 1A) in these embodiments are also allocated in a checker board pattern. In these embodiments, metal connection 46 is formed to connect the cathode of diode D2 in SCR/diode-string unit 20A to the anode of diode D3 in SCR/diode-string unit 20B. Accordingly, SCR/diode-string combo unit 44F includes a diode string including four diodes D1, D2, D3, and D4 biased in the same direction. With the diode string including four diodes, the holding voltage of SCR/diode-string combo unit 44F is increased over the holding voltage of a single SCR/diode-string unit 20F. In the illustrated embodiments, diodes D1, D2, D3 and D4 are connected in series between pad 34 and Vss node 36 in the forward direction. FIG. 5B illustrates a circuit diagram of SCR/diode-string combo unit 44F illustrated in FIG. 5A, where a SCR portion of the circuit is omitted to clearly illustrate a diode string of SCR/diode-string combo unit 44F.

Figure 5C:
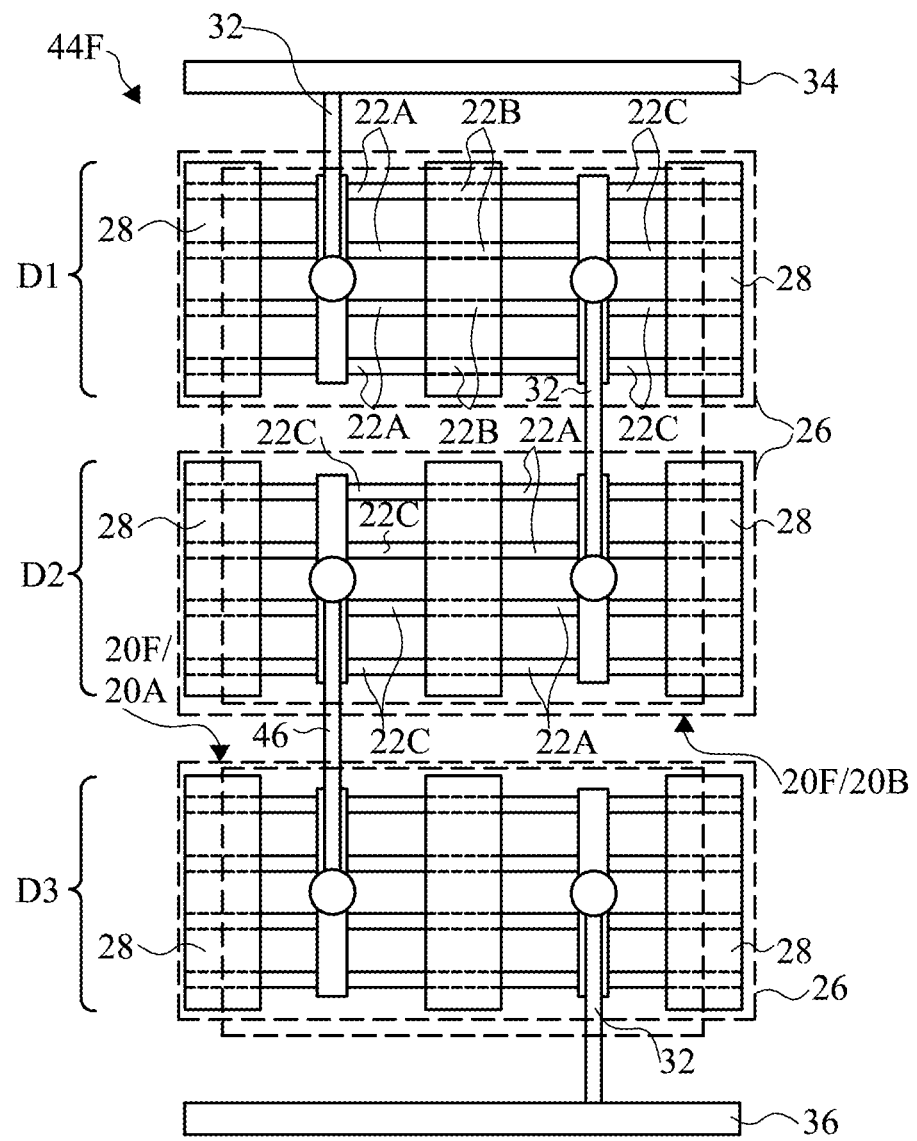
FIG. 5C illustrates a top view of an SCR/diode-string combo unit in accordance with some embodiments, wherein three diodes are connected in series to form a diode string.

FIG. 5C illustrates SCR/diode-string combo unit 44F in accordance with alternative embodiments. These embodiments are similar to the embodiments in FIG. 5A, except that there are three diodes D1, D2, and D3 (rather than four diodes) forming the respective diode string. In the illustrated embodiments, diodes D1, D2, and D3 are connected in series between pad 34 and Vss node 36 in the forward direction.

Figure 5D:
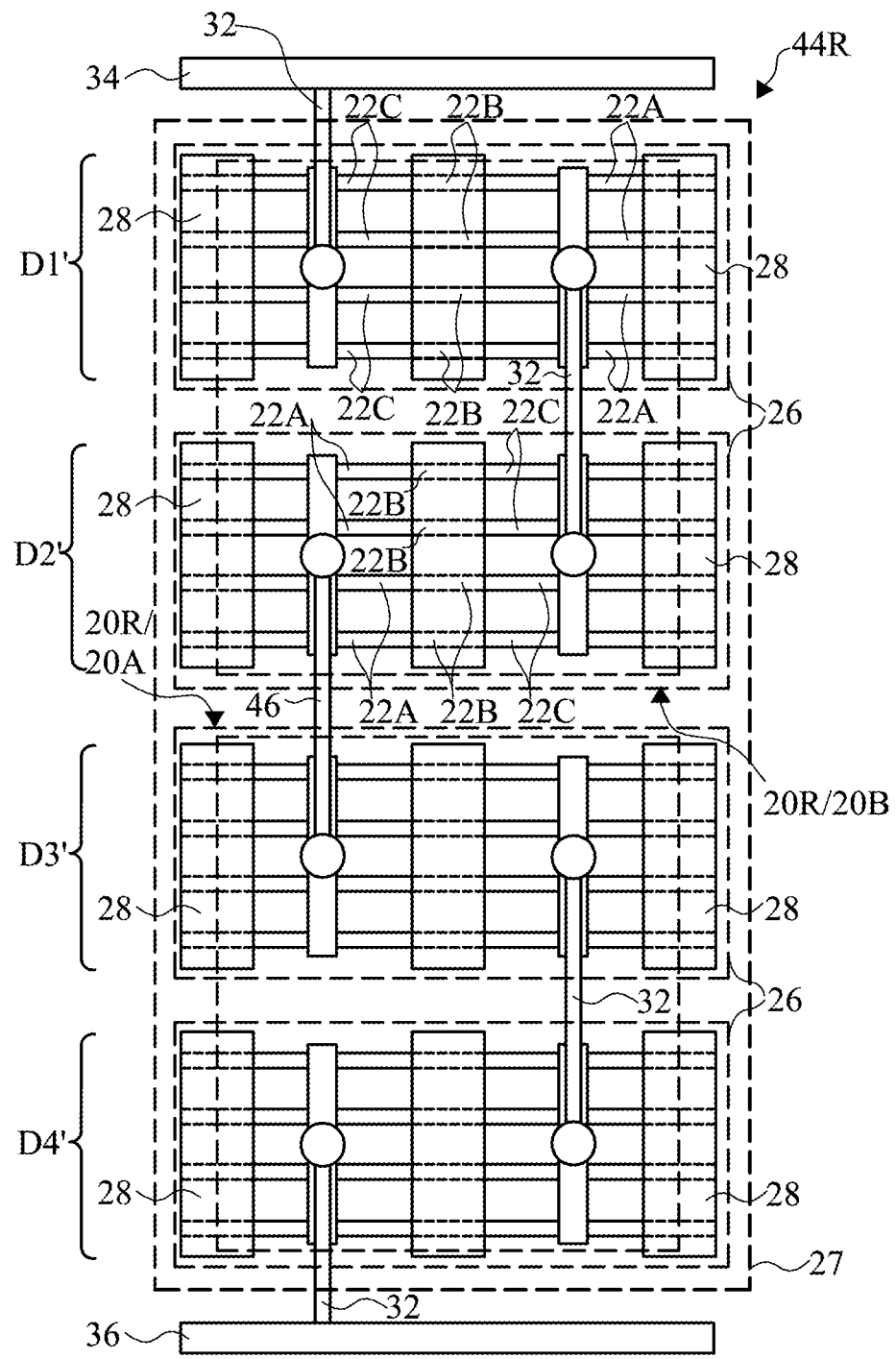
FIG. 5D illustrates a top view of an SCR/diode-string combo unit in accordance with some embodiments, wherein four diodes are connected in series to form a diode string.
Figure 5E:
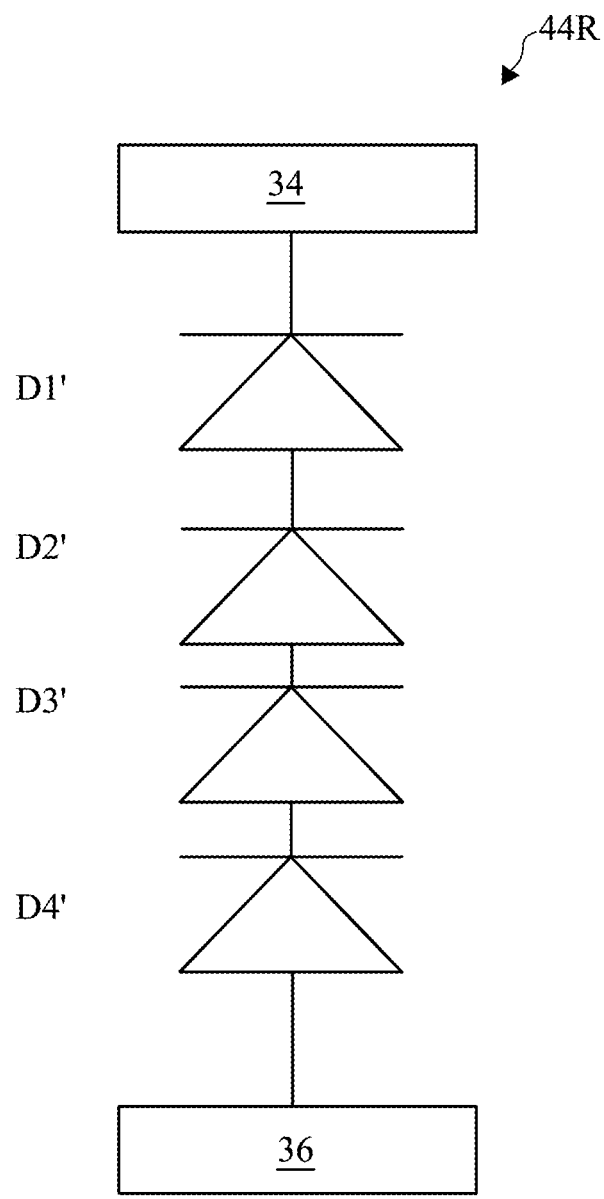
FIG. 5E illustrates a circuit diagram of the SCR/diode-string combo unit in FIG. 5D in accordance with some embodiments.

FIG. 5D illustrates SCR/diode-string combo unit 44R, which includes two SCR/diode-string units 20R (including 20A and 20B having an identical structure) cascaded between input/output pad 34 and Vss node 36. The p+ regions 22A and n+ regions 22C in these embodiments are also allocated in a checker board pattern. In these embodiments, metal connection 46 is formed to connect the anode of diode D2' in SCR/diode-string unit 20A to the cathode of diode D3' in SCR/diode-string unit 20B. Accordingly, SCR/diode-string combo unit 44R includes a diode string including four diodes D1', D2', D3', and D4' biased in the same direction. With the diode string including four diodes, the holding voltage of SCR/diode-string combo unit 44R is increased over the holding voltage of a single SCR/diode-string unit 20R. In the illustrated embodiment, D1', D2', D3', and D4' are connected in series between pad 34 and Vss node 36 in the reverses direction. FIG. 5E illustrates a circuit diagram of the SCR/diode-string combo unit 44R illustrated in FIG. 5D, where a SCR portion of the circuit is omitted to clearly illustrate a diode string of SCR/diode-string combo unit 44R.

Figure 5F:
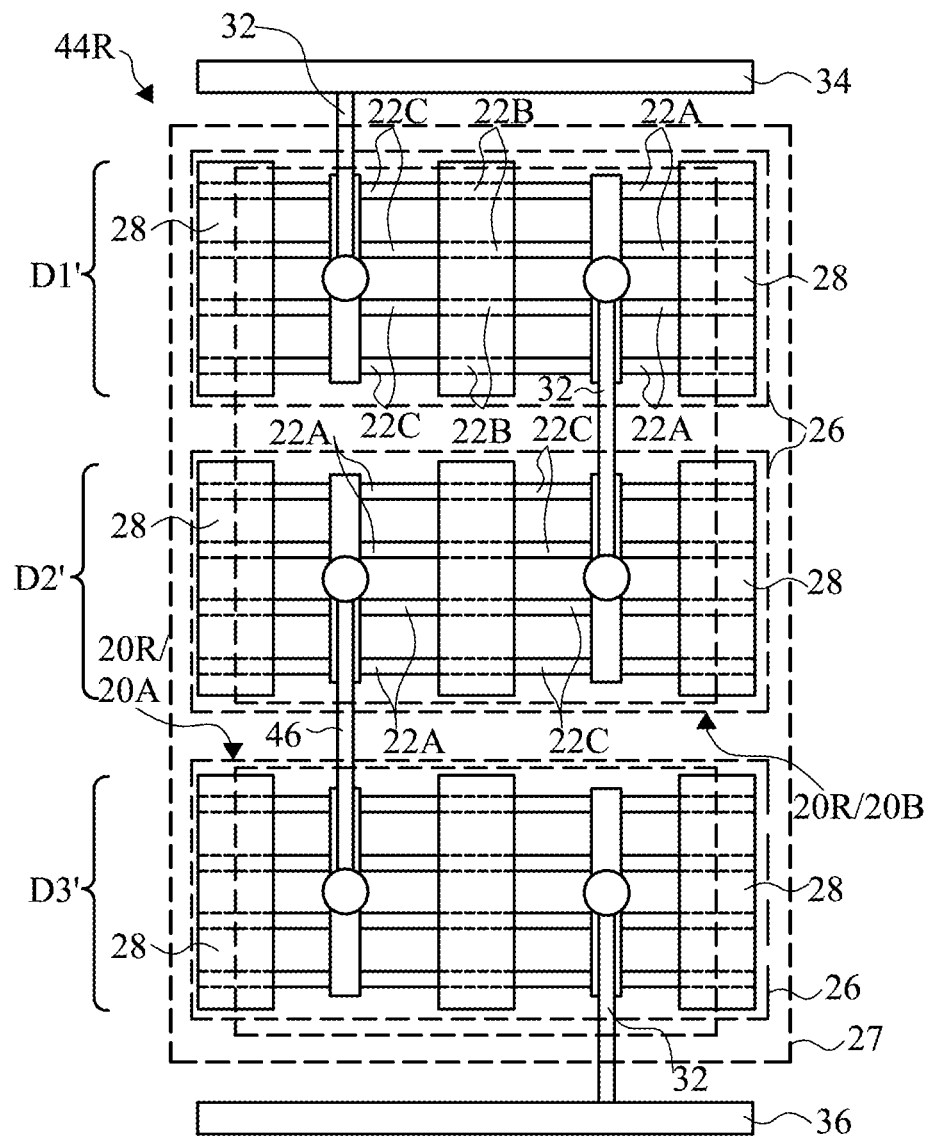
FIG. 5F illustrates a top view of an SCR/diode-string combo unit in accordance with some embodiments, wherein three diodes are connected in series to form a diode string.

FIG. 5F illustrates SCR/diode-string combo unit 44R in accordance to alternative embodiments. These embodiments are similar to the embodiments in FIG. 5D, except that three diodes D1', D2', and D3' (rather than four diodes) are connected in series between pad 34 and Vss node 36 in the reverse direction.

In alternative embodiments, more (such as 3, 4, 5, and 6) SCR/diode-string units 20F and/or 20R may be cascaded to form a SCR/diode-string combo unit. As can be found from FIGS. 1A, 1B, 5A, 5C, 5D and 5F, the example operating voltage of the SCR/diode-string combo units in accordance with the exemplary embodiments may be adjusted by changing the number of cascaded SCR/diode-string units 20F and/or 20R. FIG. 13 illustrates the example operating voltage of the SCR/diode-string combo units as a function of the number of cascaded SCR/diode-string units 20F (FIG. 1A). For example, when SCR/diode-string unit 20F has two to three diodes, as shown in FIG. 1A, the example operating voltage may be about 0.9 volts. The SCR/diode-string combo unit 44F as shown in FIG. 5A, which includes two SCR/diode-string units 20F, and hence four diodes, serially connected, has the example operating voltage of about 1.8 volts. Five serially connected diodes may also have the example operating voltage of about 1.8 Volts. When the number of serially connected diodes increases to 6~8, the example operating voltage may increase to about 2.5 volts. When the number of serially connected diodes increases to 9~11, the example operating voltage may increase to about 3.3 volts. When the number of serially connected diodes increases to 13~14, the example operating voltage may increase to about 5 volts. When the number of serially connected diodes is greater than 14, the example operating voltage may be greater than about 5 volts. Similarly, when SCR/diode-string unit 20R has two to three diodes, as shown in FIG. 1B, the example operating voltage may be about −0.9 volts. The SCR/diode-string combo unit 44R as shown in FIG. 5D, which includes two SCR/diode-string units 20R, and hence four diodes, serially connected, has the example operating voltage of about −1.8 volts. Five serially connected diodes may also have the example operating voltage of about −1.8 Volts. When the number of serially connected diodes increases to 6~8, the example operating voltage may be about −2.5 volts. When the number of serially connected diodes increases to 9~11, the example operating voltage may be about −3.3 volts. When the number of serially connected diodes increases to 13~14, the example operating voltage may be about −5 volts. When the number of serially connected diodes is greater than 14, the example operating voltage may be lower than about −5 volts.

Figure 6:
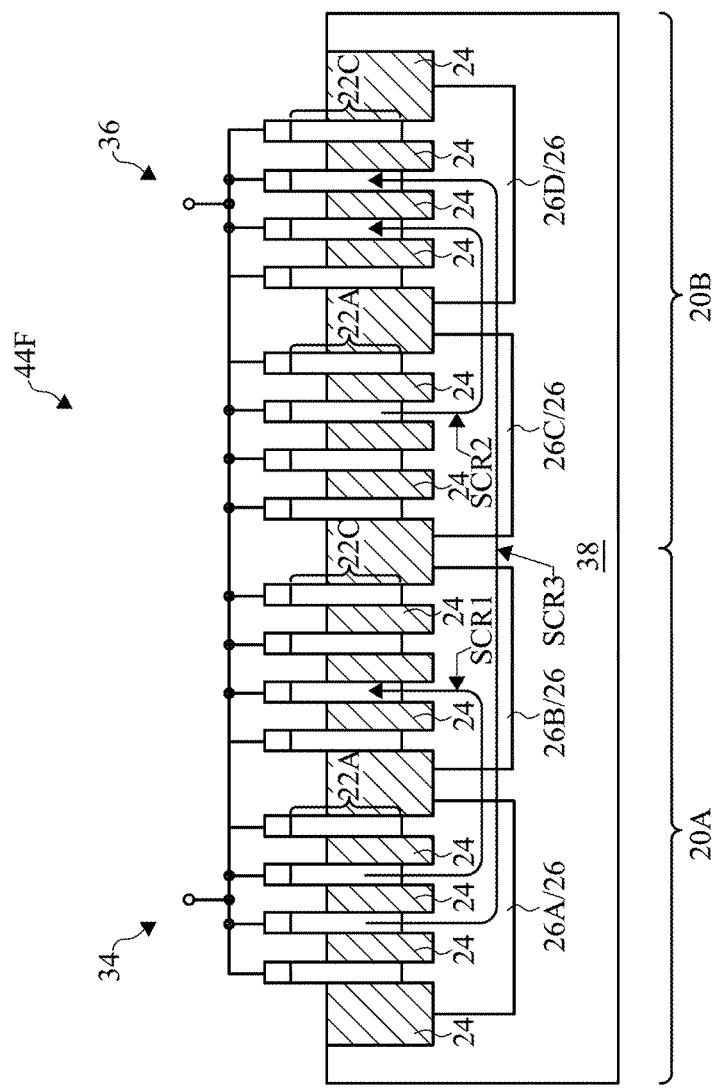
FIG. 6 illustrates a cross-sectional view of the SCR/diode-string combo unit in FIG. 5A in a plane containing B-B line in accordance with some embodiments.

FIG. 6 illustrates a cross-sectional view of the structure shown in FIG. 5A, wherein the cross-sectional view is obtained from the plane containing line B-B in FIG. 5A. As shown in FIG. 6, three SCRs are formed. SCR1 is the SCR formed by SCR/diode-string unit 20A. SCR1 includes n-well regions 26A and 26B, and the overlying p+ portions 22A and n+ portions 22C. SCR2 is the SCR formed by SCR/diode-string unit 20B. SCR2 includes n-well regions 26C and 26D, and the overlying p+ portions 22A and n+ portions 22C. SCR3 includes n-well regions 26A and 26D, and the overlying p+ portions 22A and n+ portions 22C. The details of each of SCR1, SCR2, and SCR3 may be found referring to the discussion of FIG. 2.

Figure 7:
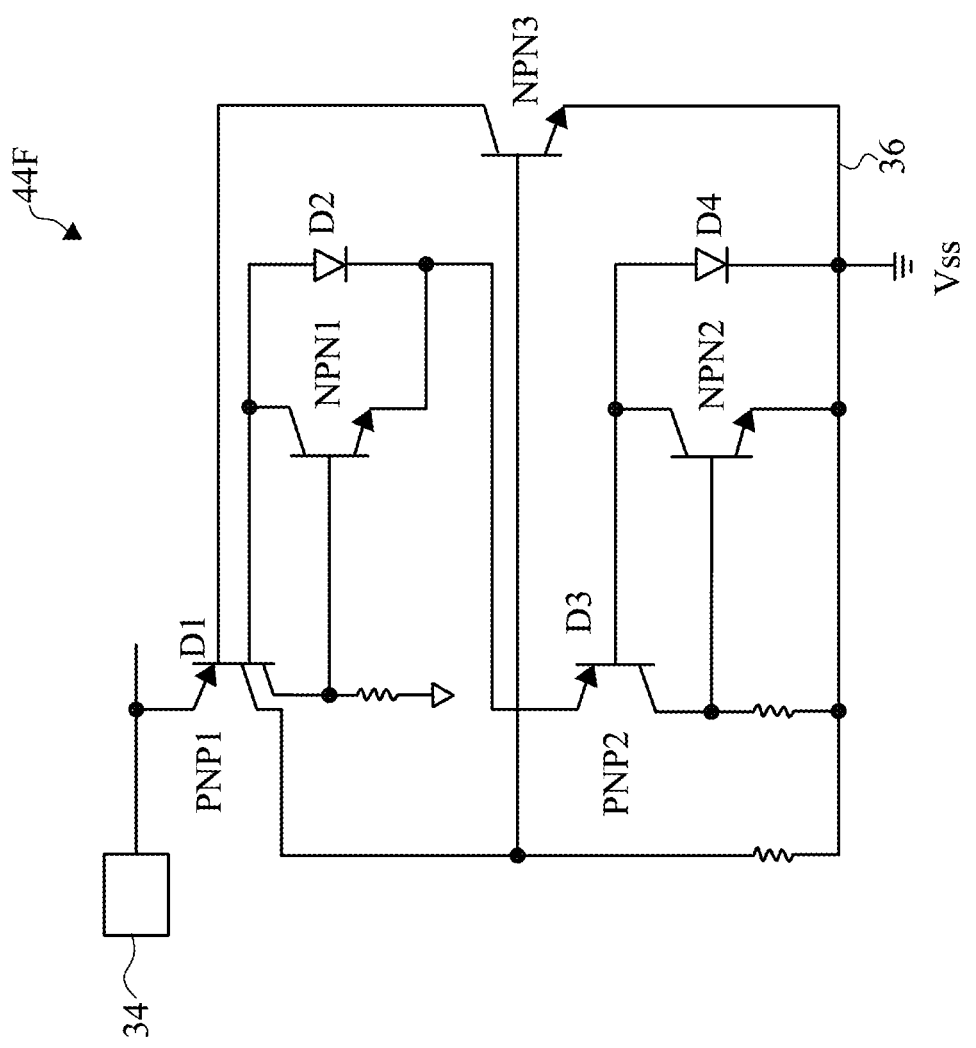
FIG. 7 illustrates a circuit diagram of the SCR/diode-string combo unit in FIG. 5A in accordance with some embodiments.

FIG. 7 illustrates a circuit diagram of SCR/diode-string combo unit 44F, wherein transistors PNP1 and NPN1 form SCR1 (FIG. 6), transistors PNP2 and NPN2 form SCR2 (FIG. 6), and transistors PNP1 and NPN3 form SCR3 (FIG. 6). Diodes D1, D2, D3, and D4 are serially connected between pad 34 and Vss node 36 in the forward direction. The SCRs SCR1, SCR2, and SCR3 are triggered by the currents of the diode string D1, D2, D3, and D4. Similarly, SCR/diode-string combo unit 44F has a high turn-on speed due to the high turn-on speed of diodes D1, D2, D3, and D4.

Figure 8A:
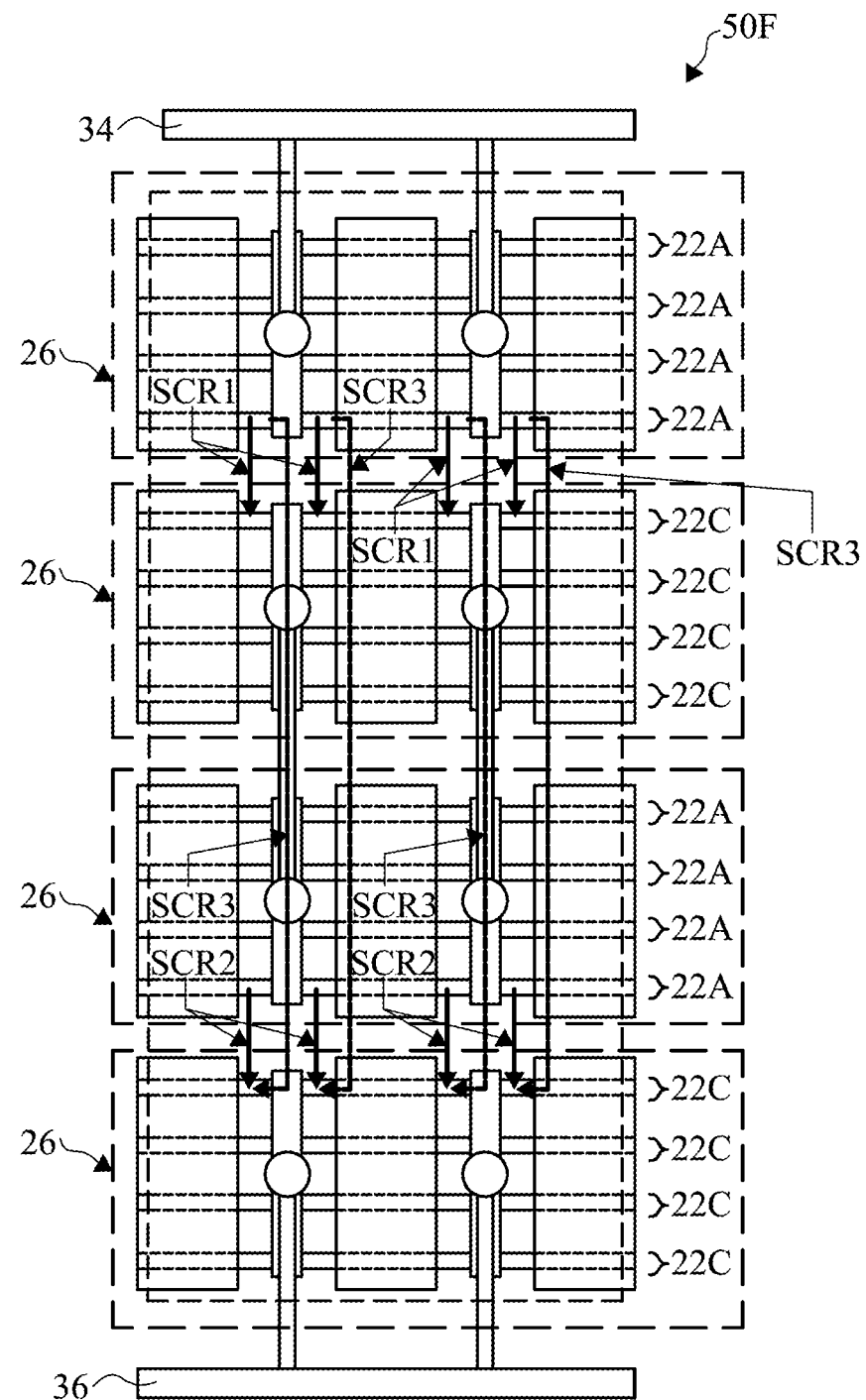
FIG. 8A illustrates a top view of a diode-string-free SCR unit in accordance with some embodiments.

FIG. 8A illustrates a diode-string-free SCR unit 50F in accordance with some embodiments. Diode-string-free SCR unit 50F includes SCRs that are connected between pad 34 and Vss node 36 in the forward direction, and does not include any diode string that are connected directly from pad 34 and Vss node 36. In these embodiments, each of semiconductor strips 22 in diode-string-free SCR unit 50F is doped to a same conductivity type, with semiconductor strips 22A being of p-type, and semiconductor strips 22C being of n-type. Therefore, the portions of the same semiconductor strip 22 on the opposite sides of gate stacks 28 are of the same conductivity type, and hence do not form a diode.

In FIG. 8A, SCRs SCR1, SCR2, and SCR3 are marked, wherein each of the SCRs SCR1, SCR2, and SCR3 is formed of a p+ strip, an n+ strip, the underlying n-well regions 26, and the p-sub 38 underlying n-well regions 26. Accordingly, diode-string-free SCR unit 50F has a similar ability for conducting high ESD currents as SCR/diode-string combo units 44F (FIGS. 5A, 5B, 5C, 6 and 7).

Figure 8B:
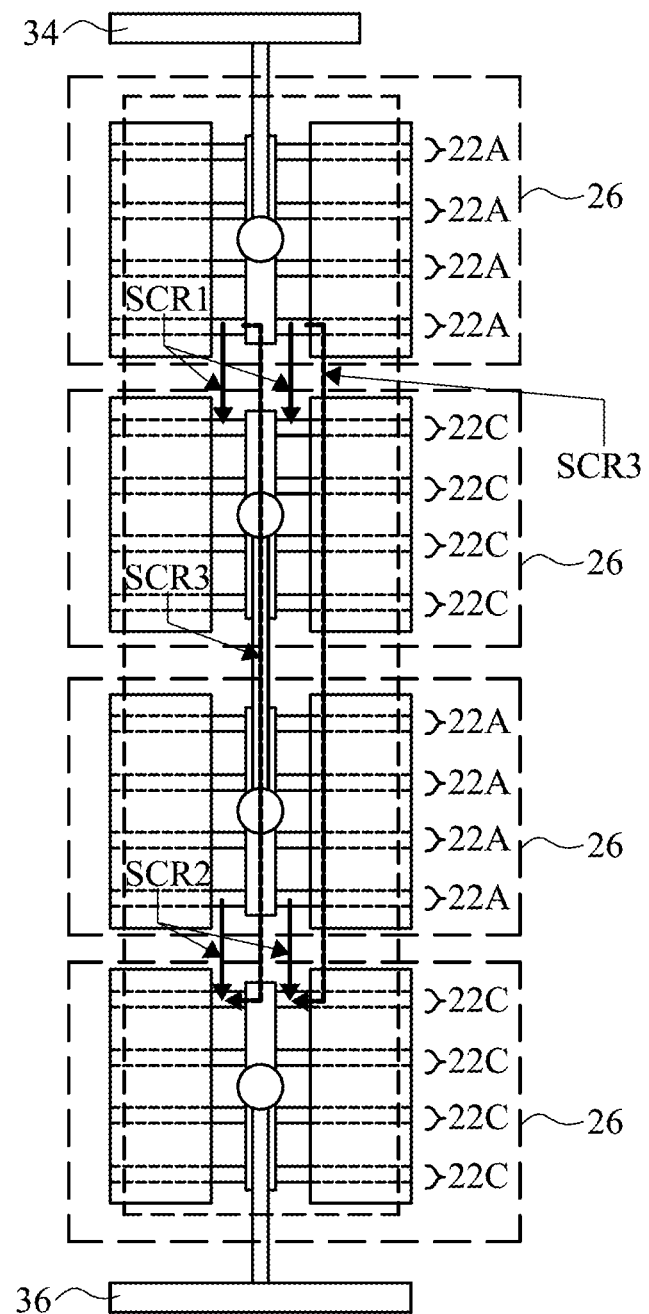
FIG. 8B illustrates a top view of a diode-string-free SCR unit in accordance with some embodiments, wherein the diode-string-free SCR unit includes a half of the diode-string-free SCR unit shown in FIG. 8A.

FIG. 8B illustrates diode-string-free SCR unit 50F in accordance with alternative embodiments. These embodiments are similar to the embodiments in FIG. 8A, except that the diode-string-free SCR unit 50F in these embodiments includes a half (the left half or the right half) of the diode-string-free SCR unit 50F in FIG. 8A. Alternatively stated, the diode-string-free SCR unit 50F in FIG. 8A may be assembled by placing two of the diode-string-free SCR unit 50F in FIG. 8B together.

Figure 8C:
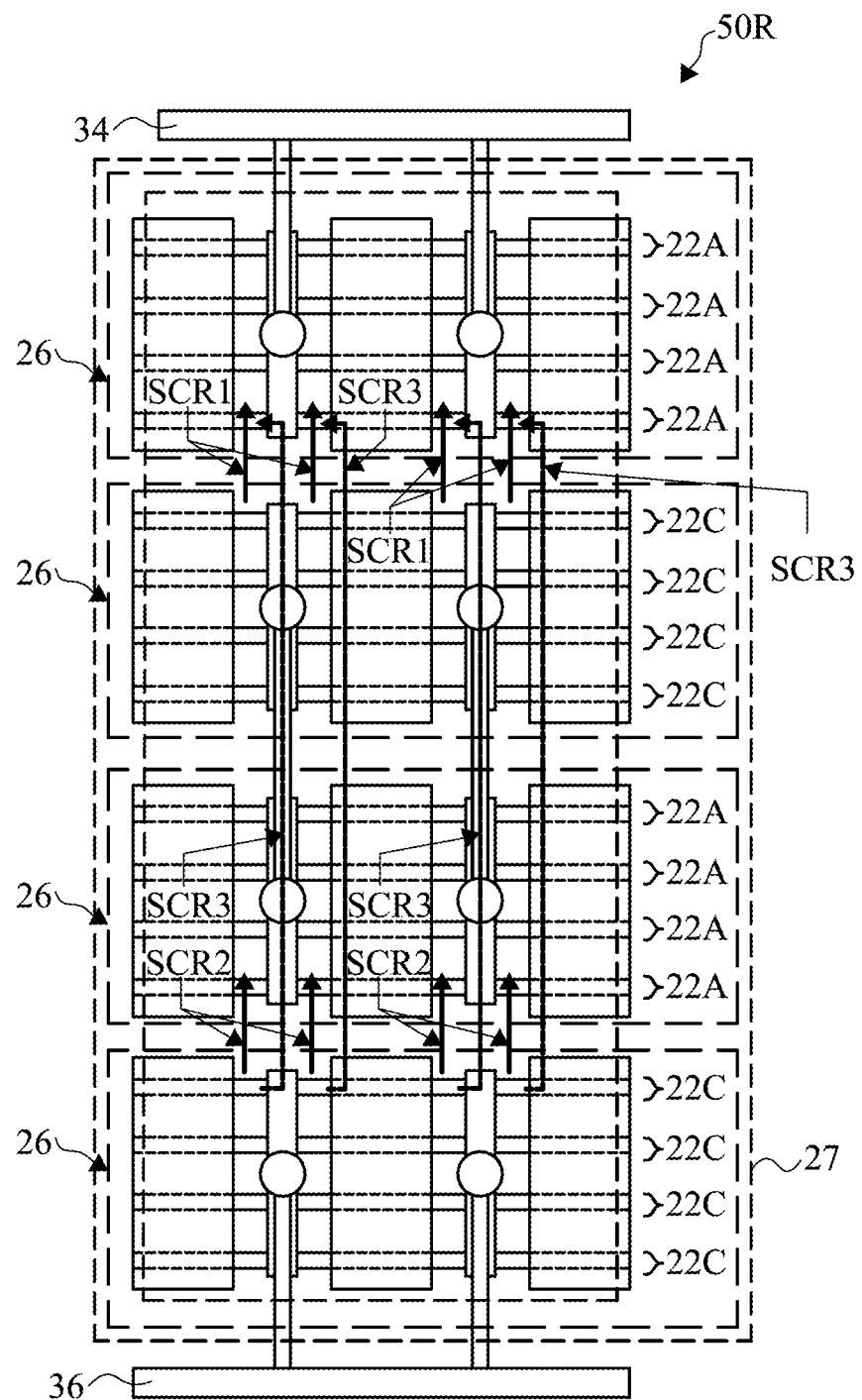
FIG. 8C illustrates a top view of a diode-string-free SCR unit in accordance with some embodiments.

FIG. 8C illustrates a diode-string-free SCR unit 50R in accordance with some embodiments. Diode-string-free SCR unit 50R includes SCRs that are connected between pad 34 and Vss node 36 in the reverse direction, and does not include any diode string that are connected directly from pad 34 and Vss node 36. In these embodiments, each of semiconductor strips 22 in diode-string-free SCR unit 50R is doped to a same conductivity type, with semiconductor strips 22A being of p-type, and semiconductor strips 22C being of n-type. Therefore, the portions of the same semiconductor strip 22 on the opposite sides of gate stacks 28 are of the same conductivity type, and hence do not form a diode.

SCR/diode-string units 20F and 20R (FIGS. 1A and 1B) and SCR/diode-string combo units 44F and 44R (FIGS. 5A, 5B. 5C, 5D, 5E and 5F) have the advantageous features of high turning-on speed, and hence are capable of reducing CDM overshoot. On the other hand, diode-string-free SCR units 50F and 50R (FIGS. 8A, 8B and 8C) have more SCRs, and hence can provide better ESD protection for high-ESD-current applications. Accordingly, by combining SCR/diode-string units 20F and 20R, and SCR/diode-string combo units 44F and 44R with diode-string-free SCR units 50F and 50R, the requirement of reducing CDM overshoot and conducting high ESD current may be satisfied.

FIGS. 9A, 10, 11, 12A, 12B, 12C and 12D illustrate the top views of portions of exemplary ESD protection devices. It is appreciated that the ESD protection devices may include more portions repeating the illustrated portions. The ESD protection devices illustrated in FIGS. 9A, 10, 11, 12A, 12B, 12C and 12D have different ratios of the number of SCR/diode-string combo units 44F to the number of diode-string-free SCR units 50F. The ESD protection device illustrated in FIG. 9A includes SCR/diode-string combo units 44F, and does not include any diode-string-free SCR unit 50F. Accordingly the ratio is 1:0. In the illustrated embodiment, the ESD protection device comprises a plurality of diodes arranged in four rows and a plurality of columns. In other embodiments, a number of rows N and a number of columns M may be varied according to design requirement for the ESD protection device.

Figure 9A:
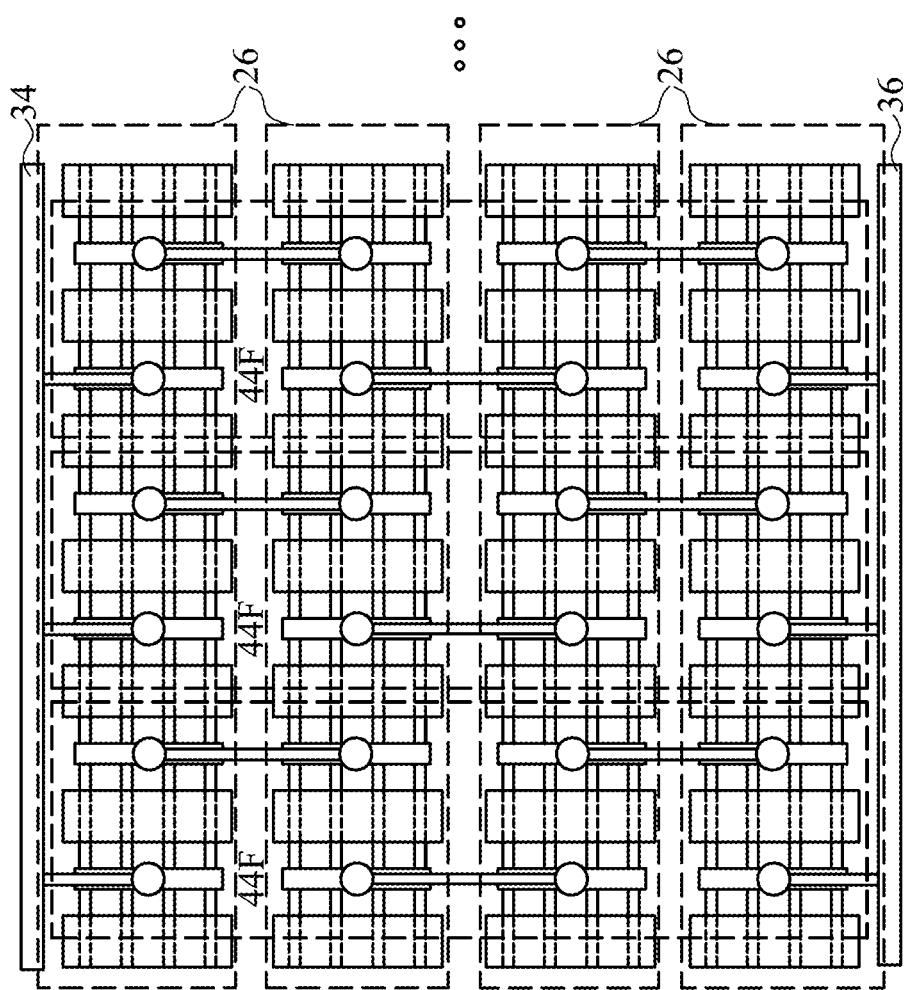
FIG. 9A illustrates an Electro-Static Discharge (ESD) protection device including a plurality of SCR/diode-string units connected in parallel in accordance with some embodiments.
Figure 9B:
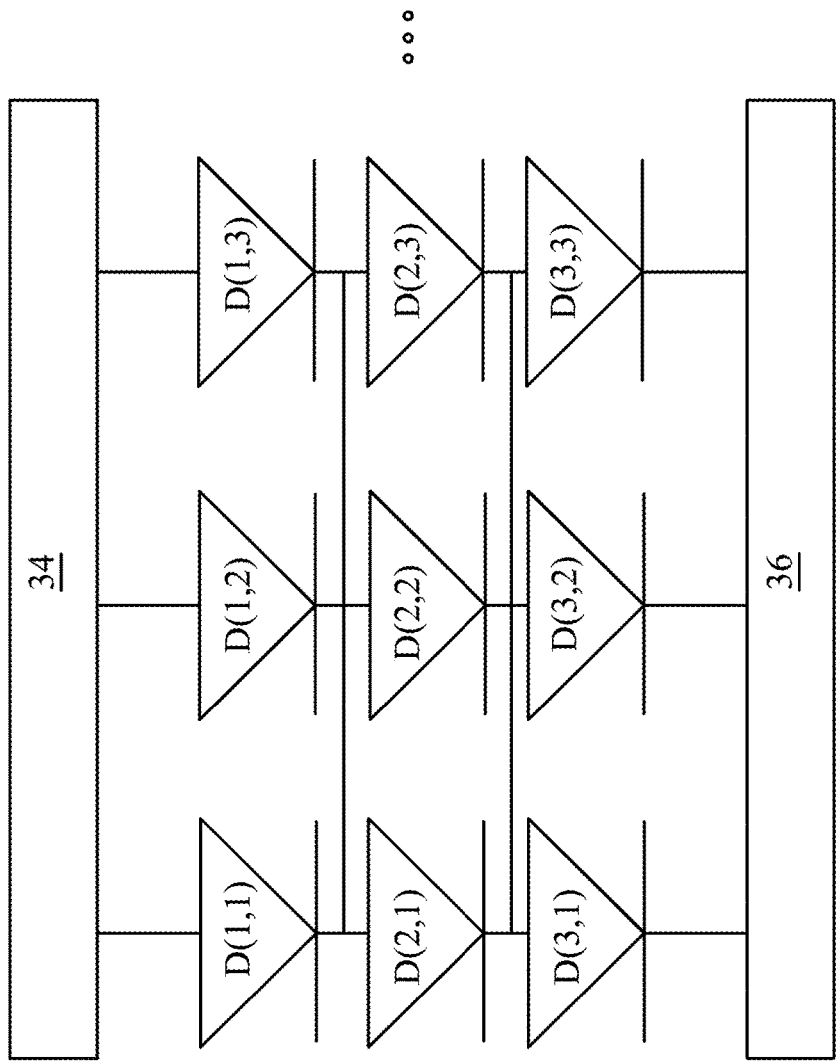
FIG. 9B illustrates a circuit diagram of the ESD protection device in FIG. 9A in accordance with some embodiments.

FIG. 9B illustrates a circuit diagram of the ESD protection device illustrated in FIG. 9A, where a SCR portion of the circuit is omitted to clearly illustrate diode strings of the ESD protection device. In the illustrated embodiment, the circuit comprises diodes D(n,m), where n runs between 1 to the number of rows N and m runs between 1 to the number of columns M. In the illustrated embodiment, the number of rows N is equal to 3. In other embodiments, the number of rows N may be varied according to design requirements for the ESD protection device. In some embodiments, all diodes in each column are coupled in series between pad 34 and Vss node 36 in the forward direction, and all diodes in each row are coupled in parallel between pad 34 and Vss node 36 in the forward direction. Accordingly, all diodes D(n,m) are arranged in a two-dimensional grid configuration.

Figure 10:
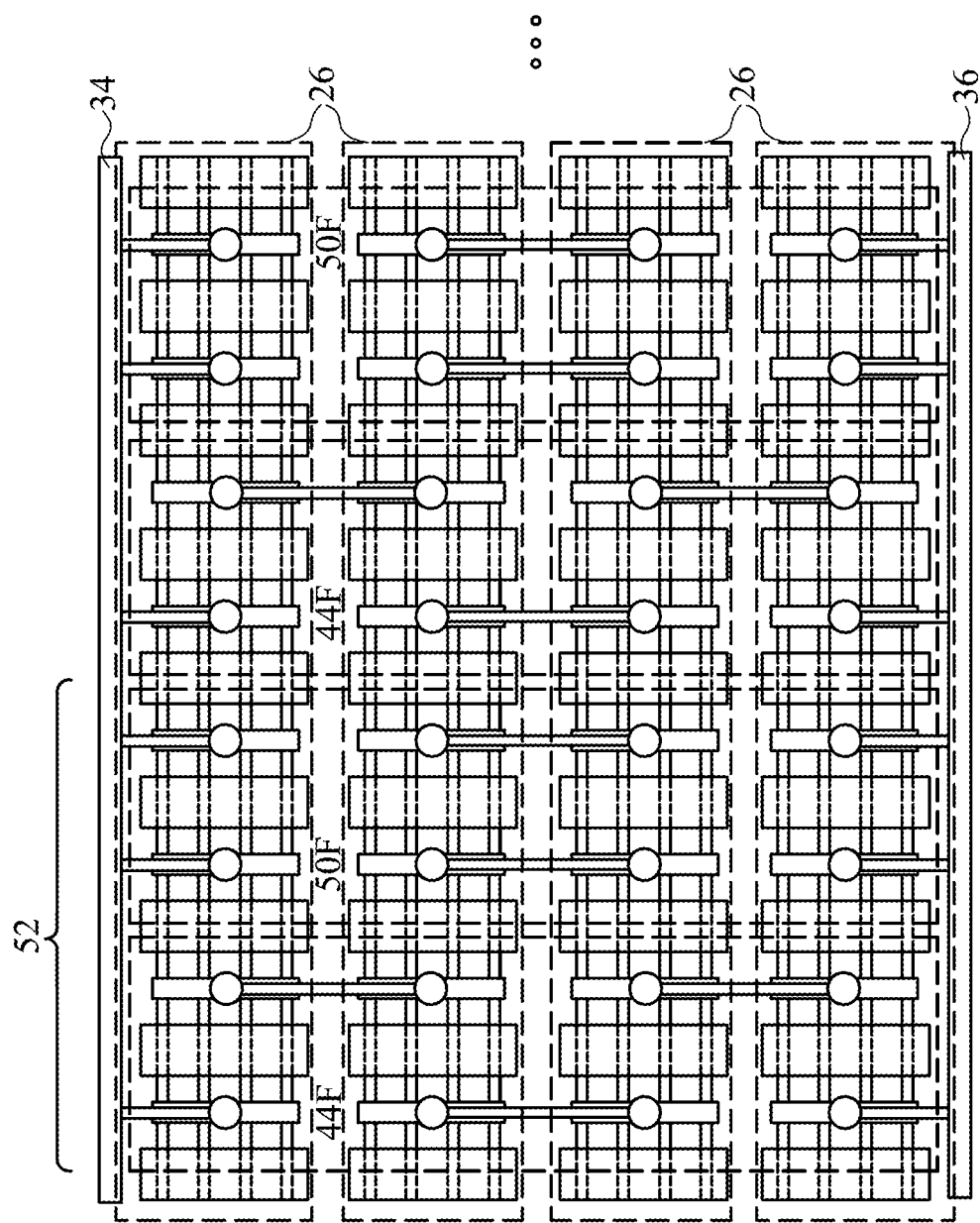
FIG. 10 illustrates an ESD protection device including SCR/diode-string unit(s) and diode-string-free SCR units in accordance with some embodiments, wherein a ratio of the number of SCR/diode-string unit(s) to the number of diode-string-free SCR units is equal to 1:1.

The ESD protection device illustrated in FIG. 10 includes one SCR/diode-string combo unit 44F corresponding to each diode-string-free SCR unit 50F. In some embodiments, such an ESD protection device may be formed by repeating a unit 52 a plurality of times. Unit 52 comprises one SCR/diode-string combo unit 44F and one diode-string-free SCR unit 50F. Accordingly, the ratio is 1:1.

Figure 11:
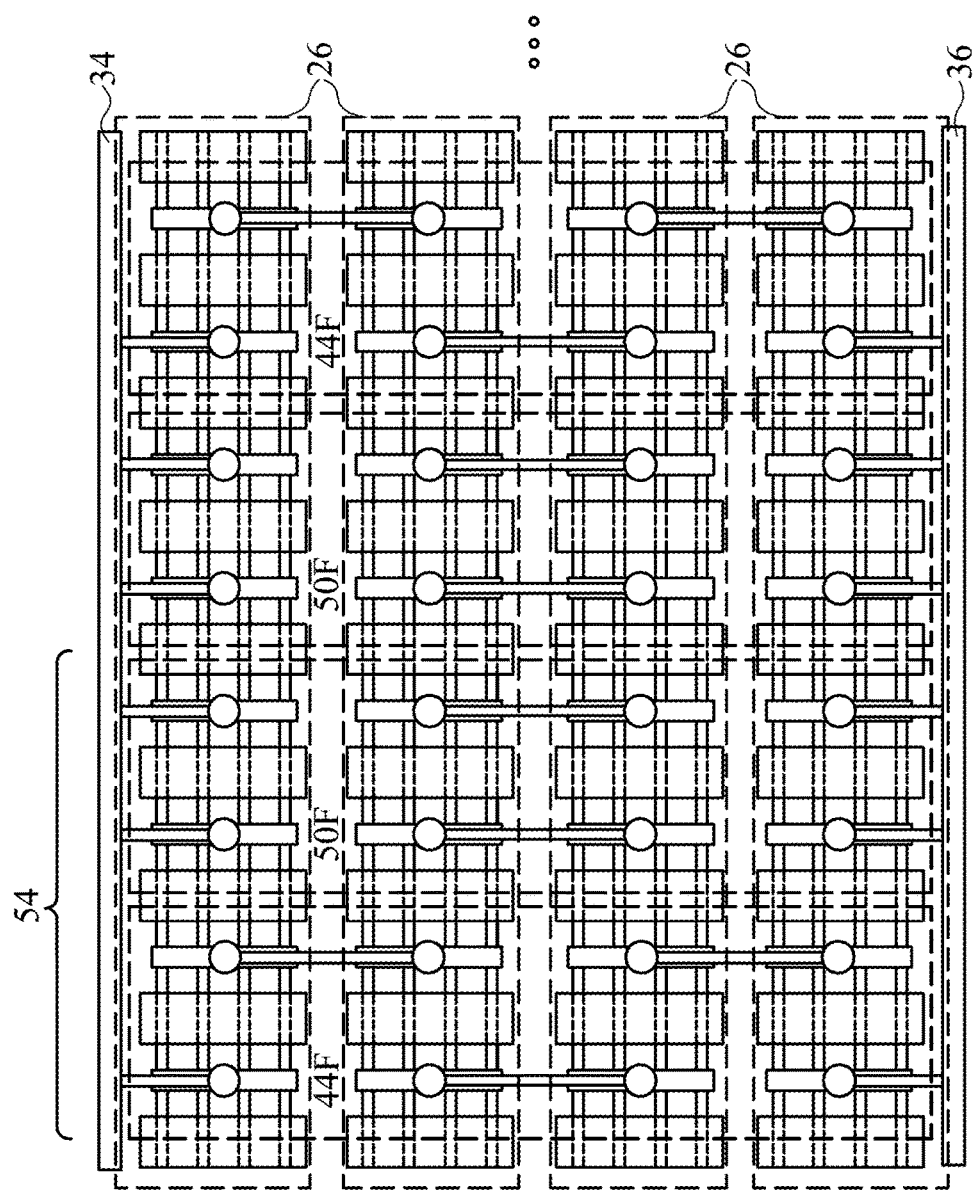
FIG. 11 illustrates an ESD protection device including SCR/diode-string unit(s) and diode-string-free SCR units in accordance with some embodiments, wherein a ratio of the number of SCR/diode-string unit(s) to the number of diode-string-free SCR units is equal to 1:2.

The ESD protection device illustrated in FIG. 11 includes one SCR/diode-string combo units 44F corresponding to every two diode-string-free SCR units 50F. In some embodiments, such an ESD protection device may be formed by repeating a unit structure 54 a plurality of times. Unit structure 54 comprises one SCR/diode-string combo unit 44F and two diode-string-free SCR units 50F, such that the leftmost diode-string-free SCR unit 50F is interposed between SCR/diode-string combo unit 44F and the rightmost diode-string-free SCR unit 50F. Accordingly, the ratio is 1:2. As described below in greater detail with reference to FIGS. 12A-12D, SCR/diode-string combo units 44F and diode-string-free SCR units 50F may be arranged in a plurality of configurations within the unit structure without changing the ratio of the number of SCR/diode-string units to the number of diode-string-free SCR units. For example, in alternative embodiments, SCR/diode-string combo unit 44F may be interposed between the leftmost diode-string-free SCR unit 50F and the rightmost diode-string-free SCR unit 50F within the unit structure 54.

Figure 12A:
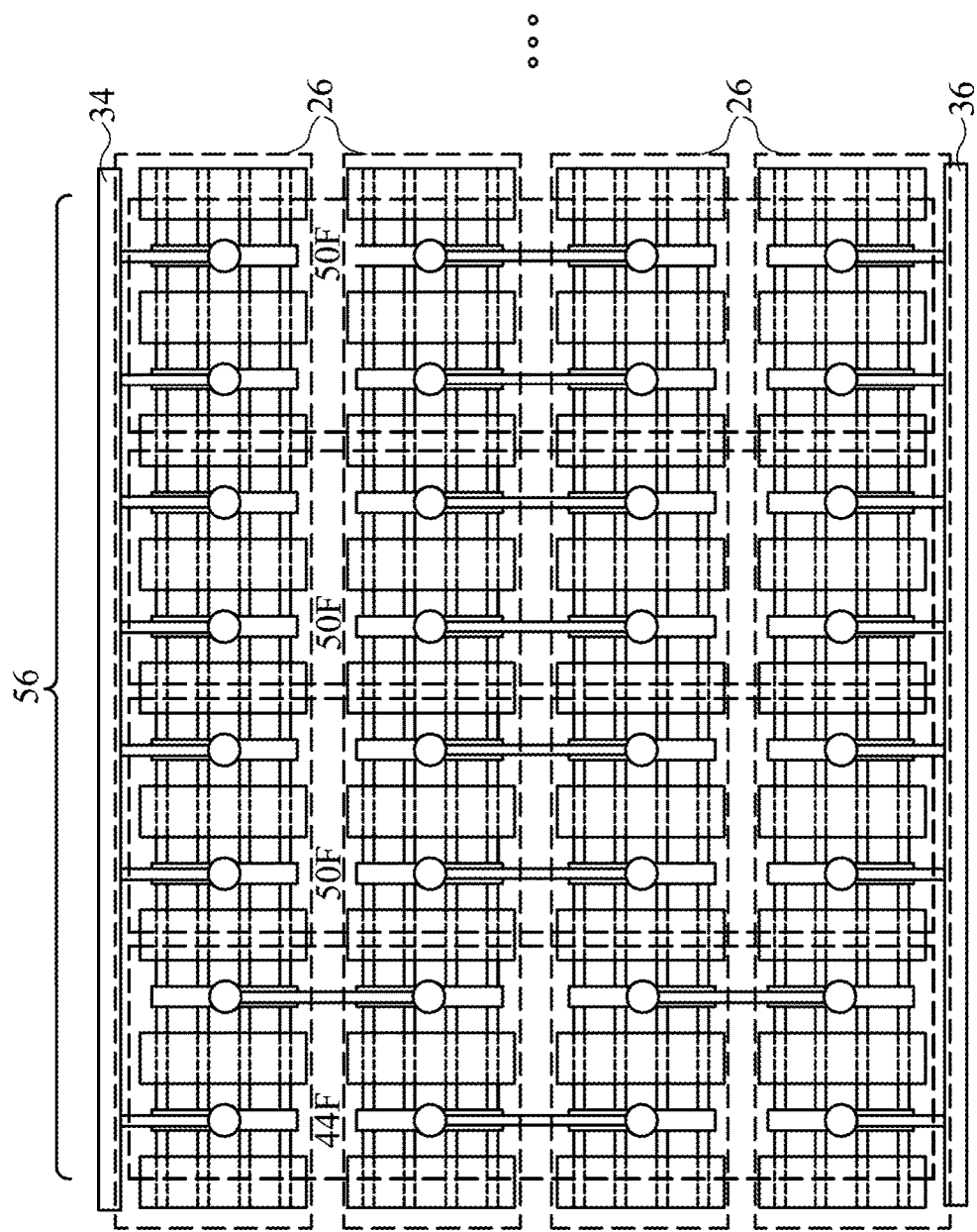
FIG. 12A illustrates an ESD protection device including SCR/diode-string unit(s) and diode-string-free SCR units in accordance with some embodiments, wherein a ratio of the number of SCR/diode-string unit(s) to the number of diode-string-free SCR units is equal to 1:3.

The ESD protection circuit illustrated in FIG. 12A includes one SCR/diode-string combo unit 44F corresponding to every three diode-string-free SCR units 50F. In some embodiments, such an ESD protection device may be formed by repeating a unit structure 56 a plurality of times. Unit structure 56 comprises one SCR/diode-string combo unit 44F and three diode-string-free SCR unit 50F. Accordingly, the ratio is 1:3.

Figure 12B:
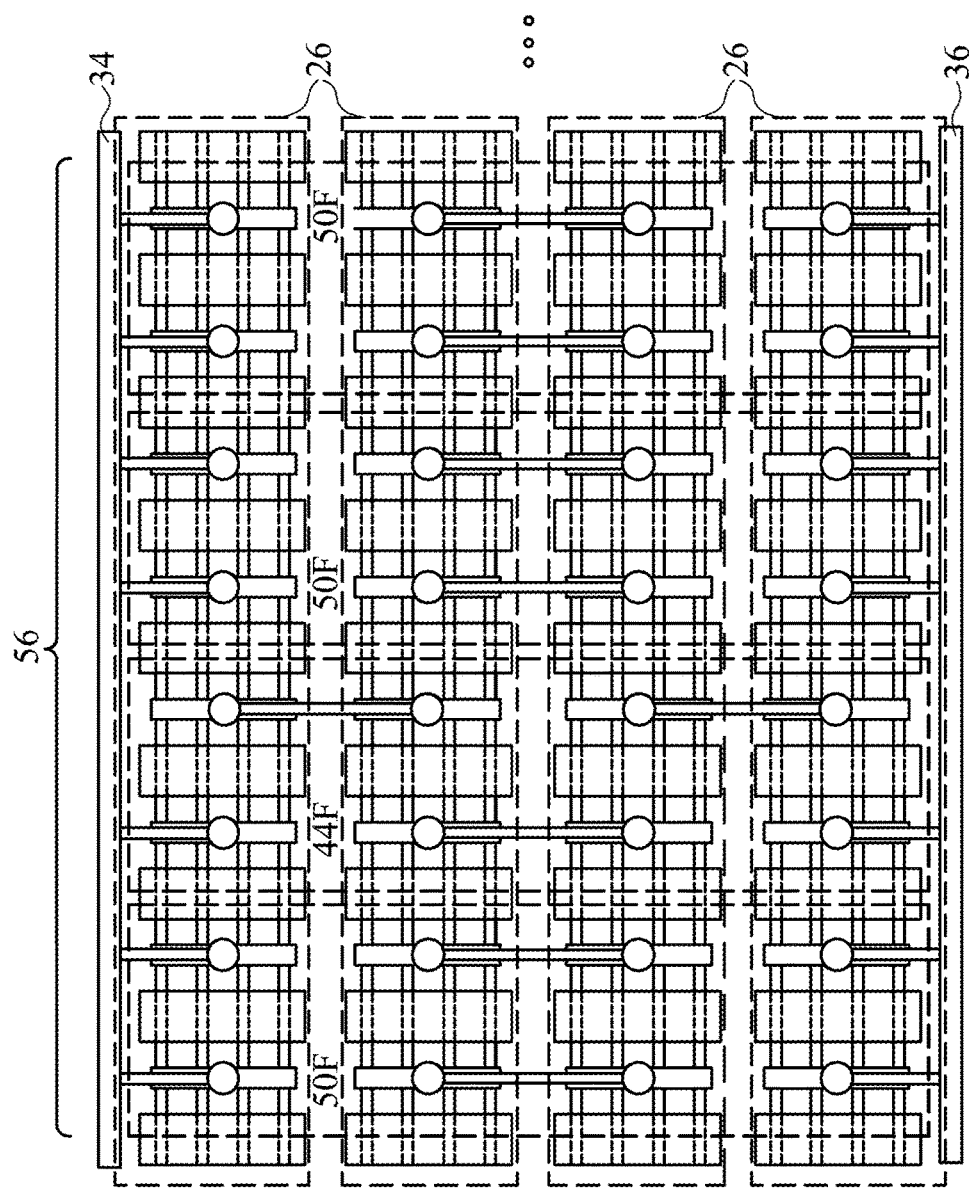
FIG. 12B illustrates an ESD protection device including SCR/diode-string unit(s) and diode-string-free SCR units, wherein a ratio of the number of SCR/diode-string unit(s) to the number of diode-string-free SCR units is equal to 1:3.

The ESD protection circuit illustrated in FIG. 12B includes one SCR/diode-string combo unit 44F corresponding to every three diode-string-free SCR units 50F. Accordingly, the ratio is 1:3. The ESD protection device illustrated in FIG. 12B is similar to ESD protection device illustrated in FIG. 12A, except within each unit structure 56 SCR/diode-string combo unit 44F is swapped with the leftmost diode-string-free SCR unit 50F.

Figure 12C:
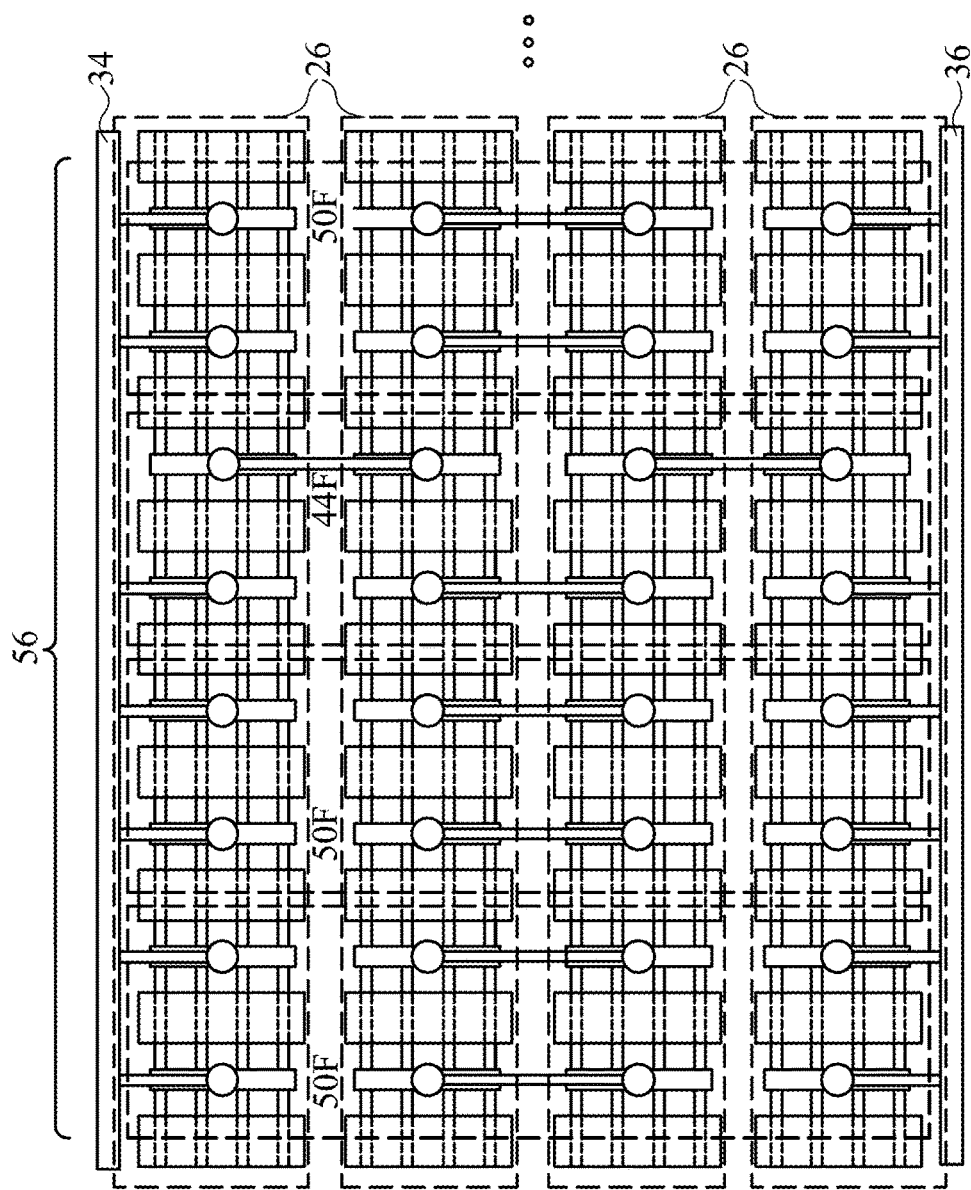
FIG. 12C illustrates an ESD protection device including SCR/diode-string unit(s) and diode-string-free SCR units in accordance with some embodiments, wherein a ratio of the number of SCR/diode-string unit(s) to the number of diode-string-free SCR units is equal to 1:3.

The ESD protection circuit illustrated in FIG. 12C includes one SCR/diode-string combo unit 44F corresponding to every three diode-string-free SCR units 50F. Accordingly, the ratio is 1:3. The ESD protection device illustrated in FIG. 12C is similar to ESD protection device illustrated in FIG. 12A, except within each unit structure 56 SCR/diode-string combo unit 44F is swapped with the middle diode-string-free SCR unit 50F.

Figure 12D:
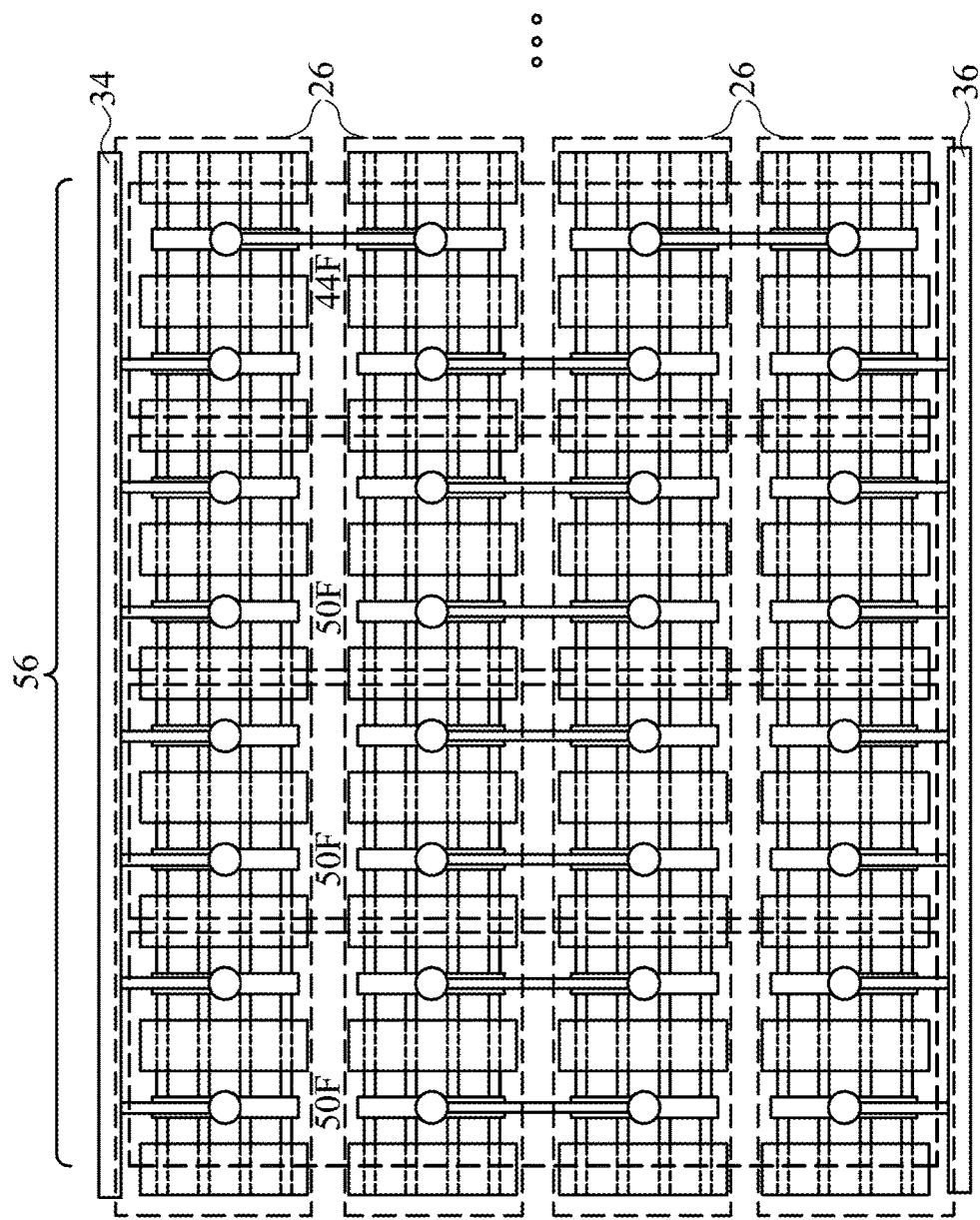
FIG. 12D illustrates an ESD protection device including SCR/diode-string unit(s) and diode-string-free SCR units in accordance with some embodiments, wherein a ratio of the number of SCR/diode-string unit(s) to the number of diode-string-free SCR units is equal to 1:3.

The ESD protection device in FIG. 12D includes one SCR/diode-string combo unit 44F corresponding to every three diode-string-free SCR units 50F. Accordingly, the ratio is 1:3. The ESD protection circuit illustrated in FIG. 12D is similar to ESD protection circuit illustrated in FIG. 12A, except within each unit structure 56 SCR/diode-string combo unit 44F is swapped with the rightmost diode-string-free SCR unit 50F.

Referring further to FIGS. 9A, 10, 11, 12A, 12B, 12C and 12D, the ESD protection devices having ratios of the number of SCR/diode-string combo units 44F to the number of diode-string-free SCR units 50F equal to 1:1, 1:2 and 1:3 are illustrated. In other embodiments, ESD protection circuits may have any suitable ratio of the number of SCR/diode-string combo units 44F to the number of diode-string-free SCR units 50F depending on design specifications for the ESD protection devices. In some embodiments, an ESD protection device may have a ratio of the number of SCR/diode-string combo units 44F to the number of diode-string-free SCR units 50F equal to N1:N2, where N1 and N2 are non-negative integers, such that N1:N2 is an irreducible fraction. Such an ESD protection circuit may be formed by repeating a unit structure a plurality of times, where the unit structure comprises N1 SCR/diode-string combo units 44F and N2 diode-string-free SCR units 50F. In some embodiments, SCR/diode-string combo units 44F and diode-string-free SCR units 50F may be arranged in a plurality configurations within the unit structure. In some embodiments when the unit structure comprises N1 SCR/diode-string combo units 44F and N2 diode-string-free SCR units 50F, the number of possible configurations is equal to a binomial coefficient (N1+N2)!/(N1!*N2!).

Referring further to FIGS. 9A, 10, 11, 12A, 12B, 12C and 12D, the ESD protection devices comprise SCR/diode-string combo units 44F and diode-string-free SCR units 50F that include diodes and SCRs connected in the forward direction between pad 34 and Vss node 36. Accordingly, the ESD protection circuits illustrated in FIGS. 9A, 10, 11, 12A, 12B, 12C and 12D are configured to provide protection for positive voltages. In other embodiments, by replacing SCR/diode-string combo units 44F and diode-string-free SCR units 50F with SCR/diode-string combo units 44R and diode-string-free SCR units 50R, respectively, ESD protection devices that are configured to provide protection for negative voltages may be formed.

Figure 14A:
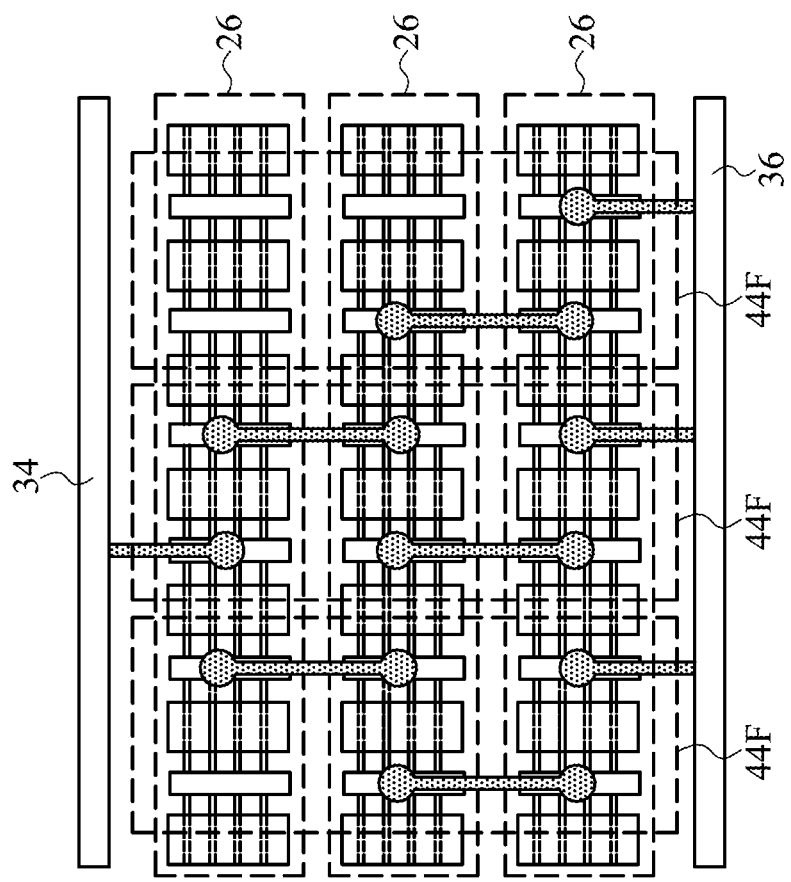
FIG. 14A illustrates an ESD protection device including a plurality of SCR/diode-string units connected in parallel in accordance with some embodiments.

FIG. 14A illustrates an ESD protection device including a plurality of SCR/diode-string combo units 44F connected in parallel in accordance with some embodiments. The ESD protection device illustrated in FIG. 14A is similar to the ESD protection device illustrated in FIG. 9A, except a subset of diodes D(n,m) is connected between pad 34 and Vss node 36. Accordingly, the subset of diodes D(n,m) may be arranged in an incomplete two-dimensional grid configuration, such that at least two rows and/or at least two columns of the incomplete two-dimensional grid comprise different number diodes.

Figure 14B:
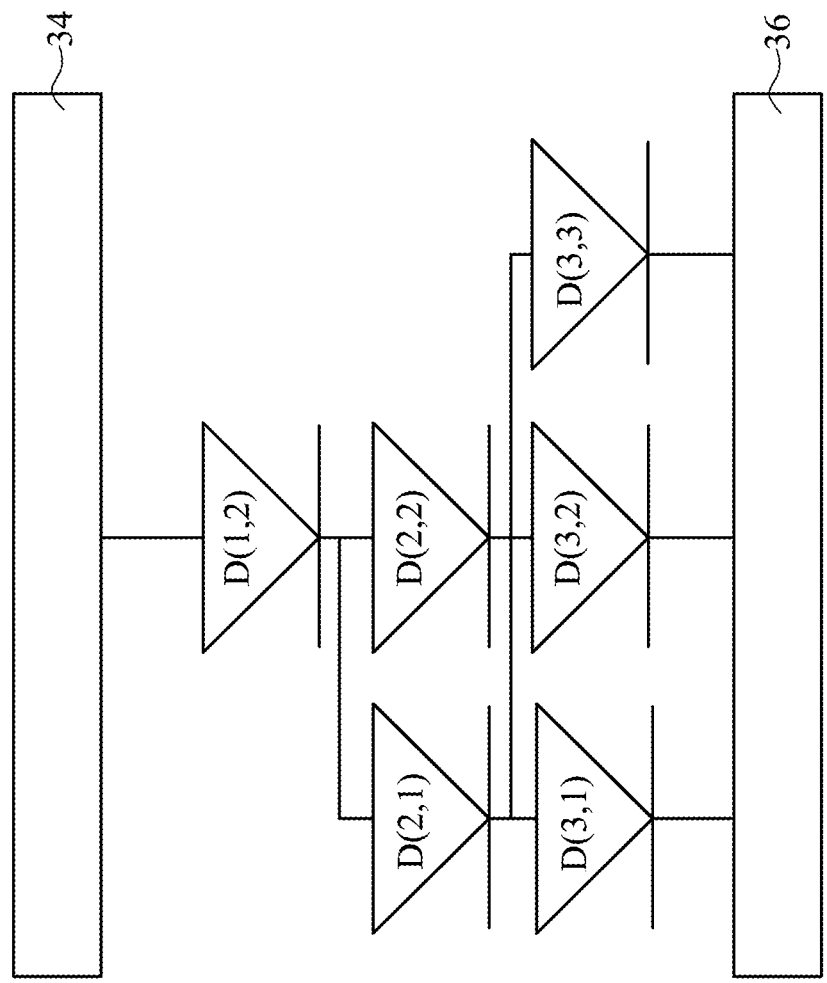
FIG. 14B illustrates a circuit diagram of the ESD protection device in FIG. 14A in accordance with some embodiments.

FIG. 14B illustrates a circuit diagram of the ESD protection device illustrated in FIG. 14A in accordance with some embodiments. In the illustrated embodiments, the ESD protection device comprises nine diodes, six of which are connected between pad 34 and Vss node 36. In the illustrated embodiment, the first row comprises diode D(1,2), the second row comprises diodes D(2,1) and D(2,2) connected in parallel, and the third row comprises diodes D(3,1), D(3,2) and D(3,3) connected in parallel. In addition, the first column comprises diodes D(2,1) and D(3,1) connected in series, the second column comprises diodes D(1,2), D(2,2) and D(3,2) connected in series, and the third row comprises diode D(3,3). A particular arrangement of diodes D(n,m) as shown in FIG. 14B is provided for illustrative purposes only. In other embodiments, diodes D(n,m) may be arranged accordingly to any suitable configuration based on design requirements for ESD devices. For example, in some embodiments, diodes of ESD devices may be arranged in a plurality of rows and columns, such that each row comprises a first number of diodes and each column comprises a second number of diodes, where the first number is between one and the number of columns M and the second number is between one and the number of rows N. In some embodiments, different rows and/or columns may have different number of diodes. In other embodiments, some rows and/or columns may have same number of diodes. Such flexibility in connecting diodes between pad 34 and Vss node 36 allows for greater flexibility in fine-tuning turn-on speeds and trigger voltages of ESD protection devices.

Referring further to FIGS. 14A and 14B, SCR/diode-string combo units 44F are arranged such that the first column of the incomplete grid comprises diodes D(2,1) and D(3,1), the second column of the incomplete grid comprises diodes D(1,2), D(2,2) and D(3,2), and the third row of the incomplete grid comprises diode D(3,3). In other embodiments, columns of the incomplete grid may be rearranged into a desired configuration by rearranging SCR/diode-string combo units 44F. For example, in some alternative embodiments, the first column of the incomplete grid may comprise diodes D(1,2), D(2,2) and D(3,2), the second column of the incomplete grid may comprise diodes D(2,1) and D(3,1), and the third row of the incomplete grid may comprise diode D(3,3), which is achieved by swapping the leftmost SCR/diode-string combo unit 44F with the middle SCR/diode-string combo unit 44F.

Figure 15A:
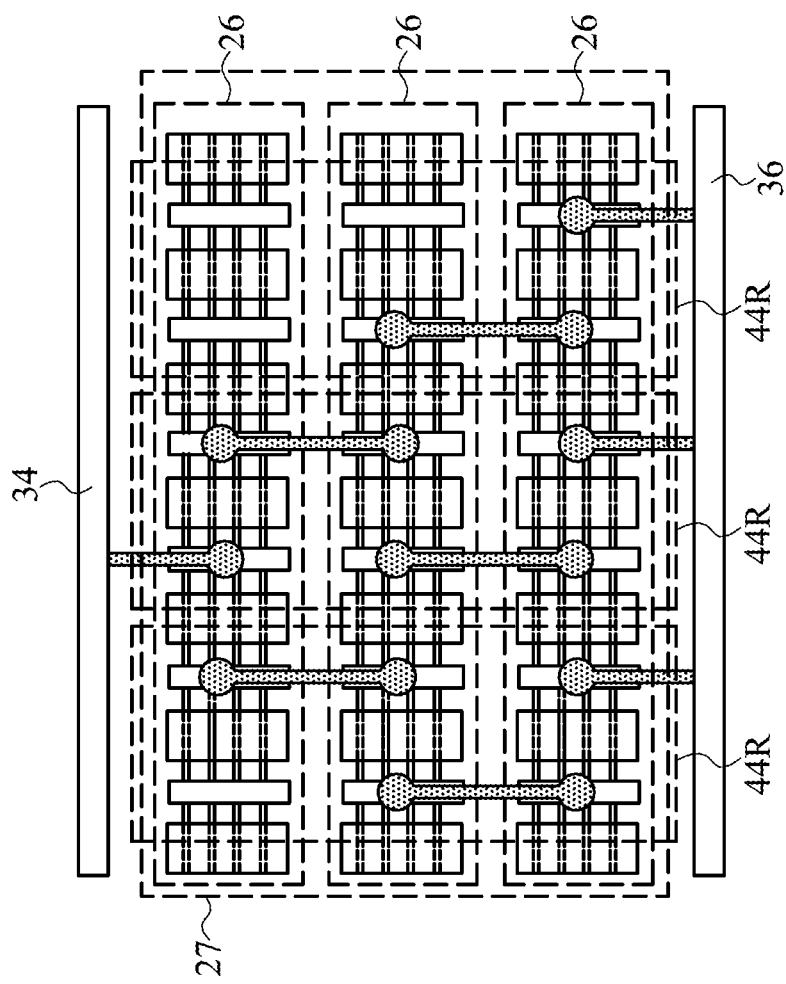
FIG. 15A illustrates an ESD protection device including a plurality of SCR/diode-string units connected in parallel in accordance with some embodiments.
Figure 15B:
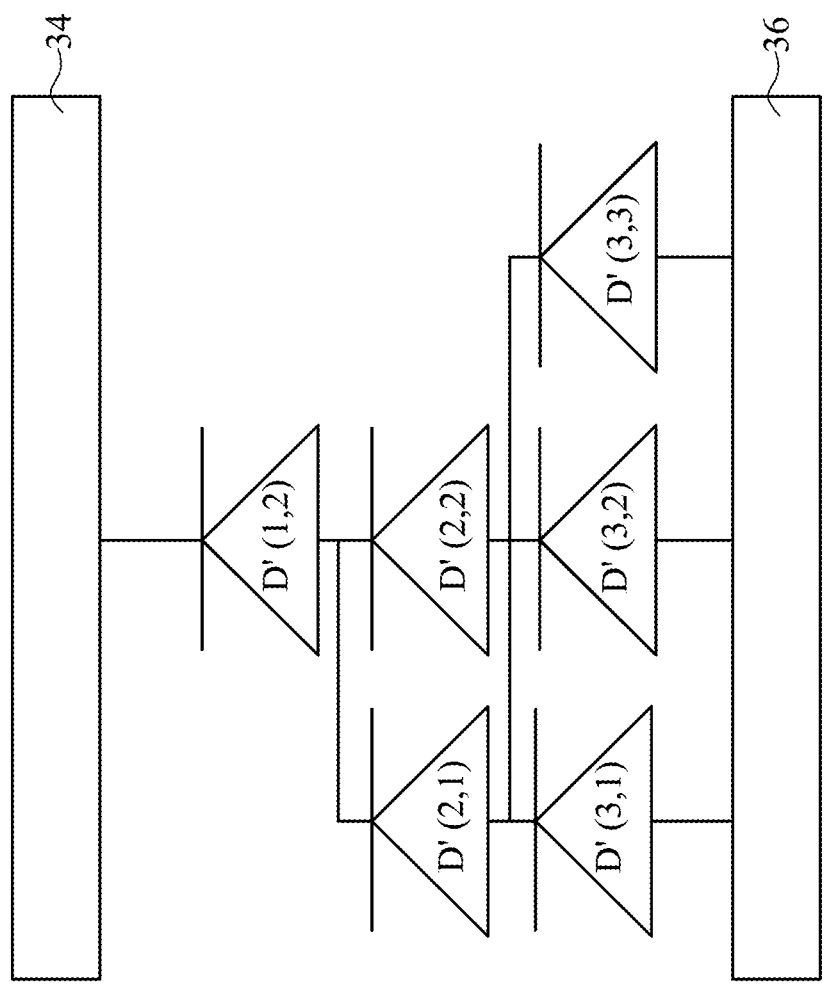
FIG. 15B illustrates a circuit diagram of the ESD protection device in FIG. 15A in accordance with some embodiments.

FIG. 15A illustrates an ESD protection device including a plurality of SCR/diode-string combo units 44R connected in parallel in accordance with some embodiments. The ESD protection device illustrated in FIG. 15A is similar to the ESD protection device illustrated in FIG. 14A, except diodes D'(n,m) are connected in the reverse direction between pad 34 and Vss node 36. Accordingly, the ESD device illustrated in FIG. 15A provides protection for negative voltages. FIG. 15B illustrates a circuit diagram of the ESD device in FIG. 15A in accordance with some embodiments.

Referring further to FIGS. 15A and 15B, SCR/diode-string combo units 44R are arranged such that the first column of the incomplete grid comprises diodes D'(2,1) and D'(3,1), the second column of the incomplete grid comprises diodes D'(1,2), D'(2,2) and D'(3,2), and the third row of the incomplete grid comprises diode D'(3,3). In other embodiments, columns of the incomplete grid may be rearranged into a desired configuration by rearranging SCR/diode-string combo units 44R. For example, in some alternative embodiments, the first column of the incomplete grid may comprise diodes D'(1,2), D'(2,2) and D'(3,2), the second column of the incomplete grid may comprise diodes D'(2,1) and D'(3,1), and the third row of the incomplete grid may comprise diode D'(3,3), which is achieved by swapping the leftmost SCR/diode-string combo unit 44R with the middle SCR/diode-string combo unit 44R.

Figure 16A:
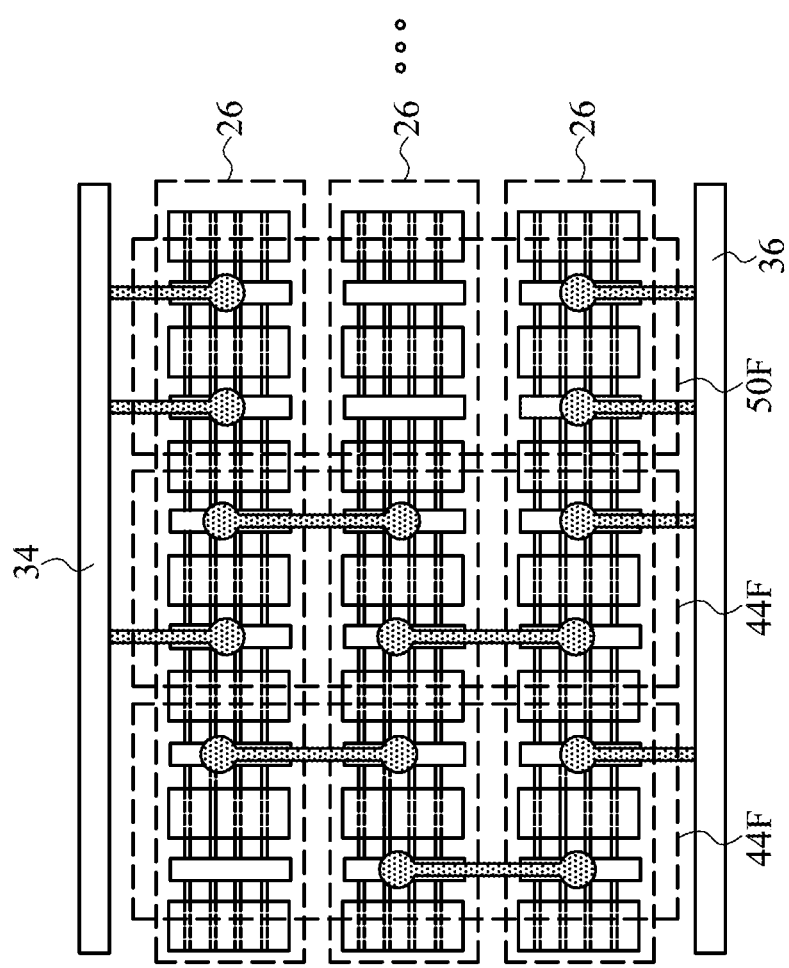
FIG. 16A illustrates an ESD protection device including SCR/diode-string units and diode-string-free SCR unit(s) in accordance with some embodiments, wherein a ratio of the number of SCR/diode-string units to the number of diode-string-free SCR unit(s) is equal to 2:1.
Figure 16B:
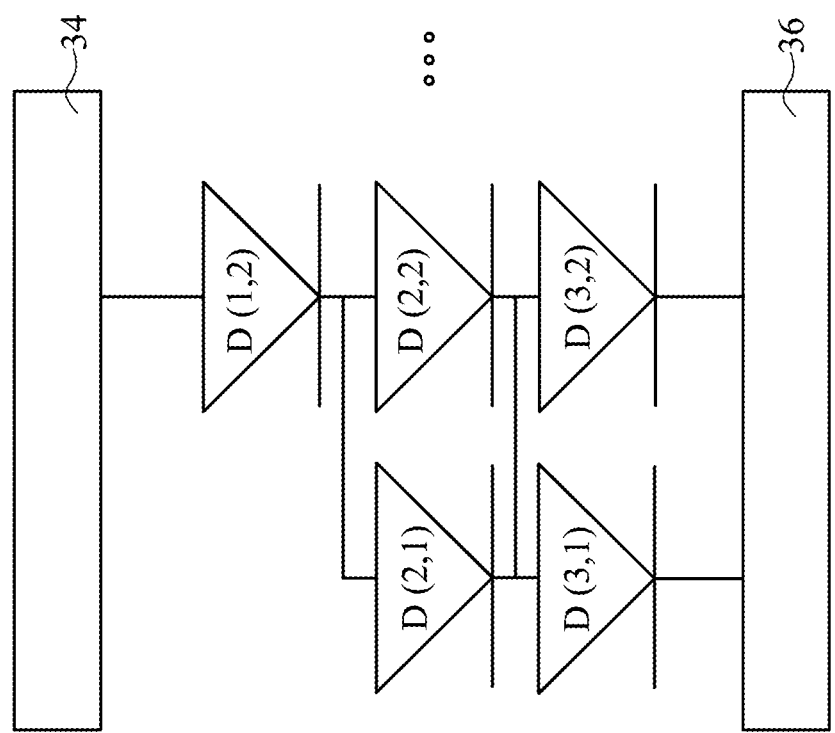
FIG. 16B illustrates a circuit diagram of the ESD protection device in FIG. 16A in accordance with some embodiments.

FIG. 16A illustrates an ESD protection device including one diode-string-free SCR unit 50F corresponding to every two SCR/diode-string combo units 44F. Accordingly, a ratio of the number of SCR/diode-string combo units 44F to the number of diode-string-free SCR units 50F of is 2:1. In addition, not all diodes of the SCR/diode-string combo units 44F are electrically coupled between pad 34 and Vss node 36. In the illustrated embodiment, two out of tree diodes of one of the two SCR/diode-string combo units 44F are coupled between pad 34 and Vss node 36. FIG. 16B illustrates a circuit diagram of the ESD protection device in FIG. 16A in accordance with some embodiments.

Figure 17:
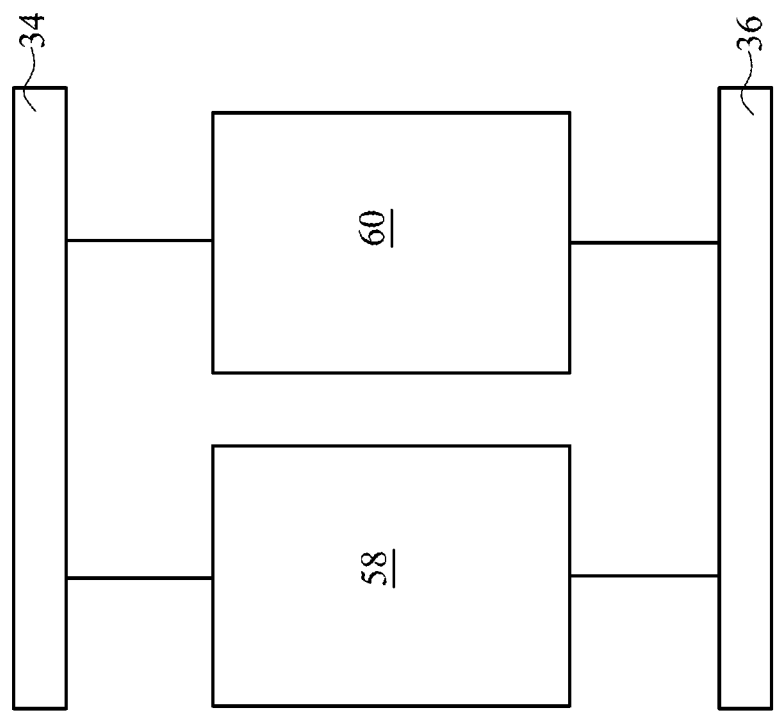
FIG. 17 illustrates an ESD protection device in accordance with some embodiments.
Figure 18:
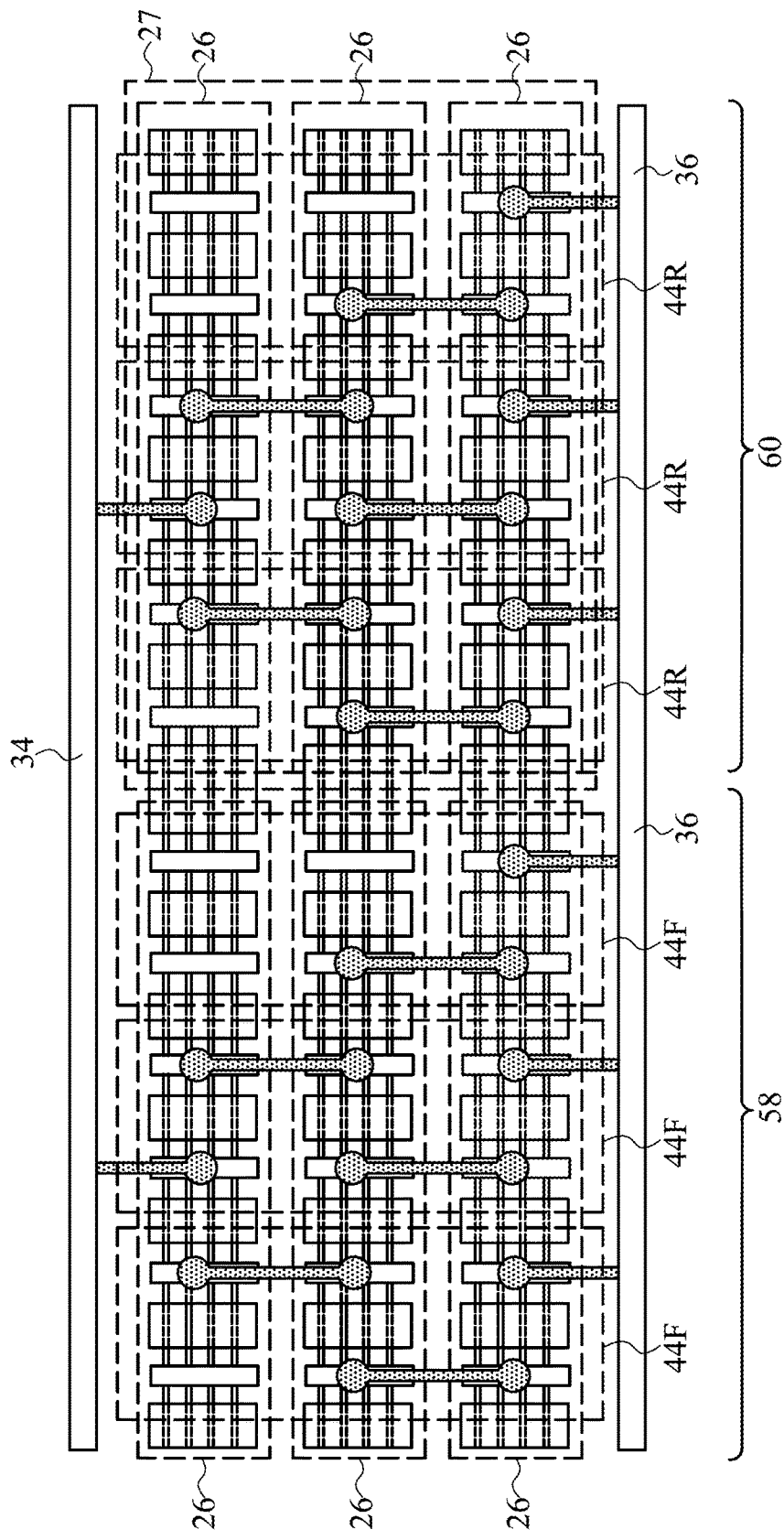
FIG. 18 illustrates an ESD protection device in accordance with some embodiments.

FIG. 17 illustrates an ESD protection device in accordance with some embodiments. In some embodiment, the ESD protection device comprises a forward branch 58 and a reverse branch 60 connected in parallel between pad 34 and Vss node 36. The forward branch 58 may be implemented using a plurality of SCR/diode-string combo units 44F and a plurality of diode-string-free SCR units 50F (such as the ESD devices illustrated in FIGS. 4, 9A, 10, 11, 12A, 12B, 12C, 12D, 14A and 16A). The reverse branch 60 may be implemented using a plurality of SCR/diode-string combo units 44R and a plurality of diode-string-free SCR units 50R. In some embodiments, the reverse branch 60 may have similar structure as the forward branch 58, except SCR/diode-string combo units 44F and diode-string-free SCR units 50F are replaced with SCR/diode-string combo SCR units 44R and diode-string-free SCR units 50R, respectively. Accordingly, the ESD protection device illustrated in FIG. 17 provides protection for both positive and negative voltages. For example, FIG. 18 illustrates an ESD protection device where the ESD protection device illustrated in FIG. 14A is implemented as the forward branch 58, and the ESD protection device illustrated in FIG. 15A is implemented as the reverse branch 60.

The embodiments of the present disclosure have several advantageous features. The formation of the ESD protection circuit is compatible with various semiconductor manufacturing processes. In particular, the formation of the ESD protection circuit is fully compatible with the manufacturing process for forming Fin Field-Effect Transistors (FinFETs), regardless of the spacing between the semiconductor strips. Furthermore, the trigger voltage and the holding voltage of the ESD protection circuit may be adjusted by changing the number of cascaded diodes in the diode string. Furthermore, the requirements for reducing CDM overshoot and conducting high ESD current may be balanced through adjusting the ratio of the number of SCR/diode-string combo units to the number of diode-string-free SCR units.

In accordance with some embodiments, an ESD protection circuit includes a plurality of groups of p-type heavily doped semiconductor strips (p+ strips) and a plurality of groups of n-type heavily doped semiconductor strips (n+ strips) forming an array having a plurality of rows and columns. In each of the rows and the columns, the plurality of groups of p+ strips and the plurality of groups of n+ strips are allocated in an alternating layout. The ESD protection circuit further includes a plurality of gate stacks, each including a first edge aligned to an edge of a group in the plurality of groups of p+ strips, and a second edge aligned to an edge of a group in the plurality of groups of n+ strips. The ESD protection circuit further includes a conductor electrically connecting a first one of the plurality of groups of p+ strips to a second one of the plurality of groups of n+ strips, wherein the first one and the second one are in a same column.

In accordance with other embodiments, an ESD protection circuit includes a semiconductor substrate of a first conductivity type, and a first well region and a second well region of a second conductivity type opposite to the first conductivity type. The first well region and the second well region are separated from each other by a portion of the semiconductor substrate. A first semiconductor strip extends in a row direction and overlaps and contacts the first well region. The first semiconductor strip includes a first heavily doped portion of the first conductivity type, a second heavily doped portion of the second conductivity type, and a third portion of the second conductivity type connecting the first portion to the second portion. A first gate stack overlaps the third portion of the first semiconductor strip. A second semiconductor strip extends in the row direction and overlaps and contacts the second well region. The second semiconductor strip includes a fourth heavily doped portion of the first conductivity type, a fifth heavily doped portion of the second conductivity type, and a sixth portion of the second conductivity type connecting the fourth portion to the fifth portion. The first and the fifth portions are in a same first column. The second and the fourth portions are in a same second column. A second gate stack overlaps the sixth portion of the second semiconductor strip. A first conductor electrically connects the second portion to the fourth portion. The first and the second gate stacks and the first and the second semiconductor strips are comprised in an SCR/diode-string unit.

In accordance with yet other embodiments, an ESD protection circuit includes a p-type semiconductor substrate, and a diode string including a first, a second, a third, and a fourth diode. The first, the second, the third, and the fourth diodes are aligned sequentially in a column. Each of the first, the second, the third, and the fourth diodes includes a p+ semiconductor strip as an anode, and an n-type semiconductor strip and a n+ semiconductor strip as a cathode. The anodes and the cathodes of the first, the second, the third, and the fourth diodes form an array. In each of rows and columns of the array, the anodes and the cathodes are allocated in an alternating layout. The ESD protection circuit further includes a gate electrode overlaps the n-type semiconductor strip, and four n-well regions, each overlapped by and in contact with one of the first, the second, the third, and the fourth diodes. The four n-well regions are separated from each other by portions of the p-type semiconductor substrate.

In accordance with yet other embodiments, and ESD protection device includes a first branch electrically coupled between a first node and a second node. The first branch includes a first plurality of well regions of a second conductivity type in a substrate of a first conductivity type, the second conductivity type being opposite the first conductivity type, the first plurality of well regions being arranged in a first plurality of rows, the first plurality of well regions being physically separated from each other, and a first plurality of diodes on the first plurality of well regions, the first plurality of diodes being arranged in the first plurality of rows and a first plurality of columns, a first subset of the first plurality of diodes being electrically coupled between the first node and the second node in a forward direction, a second subset of the first plurality of diodes being electrically decoupled between the first node and the second node. Each diode of the first plurality of diodes includes a first semiconductor strip having the first conductivity type, and a second semiconductor strip having the second conductivity type, wherein a first diode of adjacent diodes in each column of the first plurality of columns has a corresponding first semiconductor strip aligned with a corresponding second semiconductor strip of a second diode of the adjacent diodes along a first direction, wherein the first diode of adjacent diodes in each column of the first plurality of columns has a corresponding second semiconductor strip aligned with a corresponding first semiconductor strip of the second diode of the adjacent diodes along a second direction parallel to the first direction, and wherein a number of diodes electrically coupled between the first node and the second node in at least one column of the first plurality of columns is less than a number of the first plurality of rows.

In accordance with yet other embodiments, an ESD protection device includes a plurality of unit devices electrically coupled in parallel between a first node and a second node. Each unit device includes one or more Silicon-Controlled Rectifier (SCR)/diode-string combination units coupled in parallel between the first node and the second node. Each SCR/diode-string combination unit includes a first region in a first semiconductor strip, the first region having a first conductivity type, and a second region in the first semiconductor strip, the second region having a second conductivity type, the second conductivity type being opposite the first conductivity type, the first region and the second region being in a first well region, the first well region having the second conductivity type, a first junction between the first region and the second region forming a first diode. Each SCR/diode-string combination unit further includes a third region in a second semiconductor strip, the third region having the second conductivity type, a fourth region in the second semiconductor strip, the fourth region having the first conductivity type, the third region and the fourth region being in a second well region, the second well region having the second conductivity type, the first well region and the second well region being physically separated, a second junction between the third region and the fourth region forming a second diode, wherein the first diode and the second diode are two of a plurality of diodes arraigned in a single column and a plurality of rows, and wherein a number of diodes of the plurality of diodes electrically coupled between the first node and the second node are less than a number of the plurality of rows, and a first conductor electrically connecting the second region to the fourth region. Each unit device further includes one or more diode-string-free SCR units coupled in parallel between the first node and the second node. Each diode-string-free SCR unit includes a fifth region and a sixth region in the first semiconductor strip, the fifth region and the sixth region having the first conductivity type, the fifth region and the sixth region being in the first well region, and a seventh region and an eighth region in the second semiconductor strip, the seventh region and the eighth region having the second conductivity type, the seventh region and the eighth region being in the second well region.

In accordance with yet other embodiments, an ESD protection device includes a substrate of a first conductivity type, the substrate having a first well region, a second well region and a third well region of a second conductivity type, and a fourth well region and a fifth well region of the second conductivity type within the third well region, the second conductivity type being different from the first conductivity type, the first well region, the second well region and the third well region being physically separated from each other, the fourth well region and the fifth well region being physically separated from each other, a first semiconductor strip extending over the first well region, the third well region and the fourth well region, the first semiconductor strip having a first region of the first conductivity type and a second region of the second conductivity type within the first well region, and a third region of the second conductivity type and a fourth region of the first conductivity type within the fourth well region, a first junction between the first region and the second region forming a first diode, and a second junction between the third region and the fourth region forming a second diode, a second semiconductor strip extending over the second well region, the third well region and the fifth well region, the second semiconductor strip having a fifth region of the second conductivity type and a sixth region of the first conductivity type within the second well region, and a seventh region of the first conductivity type and a eighth region of the second conductivity type within the fifth well region, a third junction between the fifth region and the sixth region forming a third diode, and a fourth junction between the seventh region and the eighth region forming a fourth diode, a first node electrically connected to the first region and the third region, and a second node electrically connected to the fifth region and the seventh region, wherein the first diode and the second diode are two of a first plurality of diodes electrically coupled between the first node and the second node in a forward direction, the first plurality of diodes being arranged in a first plurality of rows and a first plurality of columns, a number of diodes of the first plurality of diodes in at least one row of the first plurality of rows being less than a number of the first plurality of columns, and wherein the third diode and the fourth diode are two of a second plurality of diodes electrically coupled between the first node and the second node in a reverse direction, the second plurality of diodes being arranged in a second plurality of rows and a second plurality of columns, a number of diodes of the second plurality of diodes in at least one row of the second plurality of rows being less than a number of the second plurality of columns.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An Electro-Static Discharge (ESD) protection device comprising:
 a first branch electrically coupled between a first node and a second node, the first branch comprising:
  a first plurality of well regions of a second conductivity type in a substrate of a first conductivity type, the second conductivity type being opposite the first conductivity type, the first plurality of well regions being arranged in a first plurality of rows, the first plurality of well regions being physically separated from each other; and
  a first plurality of diodes on the first plurality of well regions, the first plurality of diodes being arranged in the first plurality of rows and a first plurality of columns, a first subset of the first plurality of diodes being electrically coupled between the first node and the second node in a forward direction, a second subset of the first plurality of diodes being electrically decoupled between the first node and the second node, each diode of the first plurality of diodes comprising:
- a first semiconductor strip having the first conductivity type; and
- a second semiconductor strip having the second conductivity type, wherein a first diode of adjacent diodes in each column of the first plurality of columns has a corresponding first semiconductor strip aligned with a corresponding second semiconductor strip of a second diode of the adjacent diodes along a first direction, wherein the first diode of adjacent diodes in each column of the first plurality of columns has a corresponding second semiconductor strip aligned with a corresponding first semiconductor strip of the second diode of the adjacent diodes along a second direction parallel to the first direction, and wherein a number of diodes electrically coupled between the first node and the second node in at least one column of the first plurality of columns is less than a number of the first plurality of rows.

2. The ESD protection device of claim 1, wherein the first conductivity type is a p-type, and wherein the second conductivity type is an n-type.

3. The ESD protection device of claim 1, wherein different rows of the first plurality of rows have different numbers of diodes of the first subset of the first plurality of diodes electrically coupled to each other.

4. The ESD protection device of claim 1, wherein different columns of the first plurality of columns have different numbers of diodes of the first subset of the first plurality of diodes electrically coupled to each other.

5. The ESD protection device of claim 1, wherein each diode of the first plurality of diodes comprises:
- a first semiconductor strip having the first conductivity type; and
- a second semiconductor strip having the second conductivity type, wherein a first diode of adjacent diodes in each column of the first plurality of columns has a corresponding first semiconductor strip aligned with a corresponding second semiconductor strip of a second diode of the adjacent diodes along a first direction, wherein the first diode of adjacent diodes in each column of the first plurality of columns has a corresponding second semiconductor strip aligned with a corresponding first semiconductor strip of the second diode of the adjacent diodes along a second direction parallel to the first direction.

6. The ESD protection device of claim 1 further comprising:
- a second branch electrically coupled between the first node and the second node, the second branch comprising:
  - a deep well region of the second conductivity type in the substrate;
  - a second plurality of well regions of the first conductivity type in the deep well region, the second plurality of well regions being arranged in a second plurality of rows, the second plurality of well regions being physically separated from each other; and
  - a second plurality of diodes on the second plurality of well regions, the second plurality of diodes being arranged in the second plurality of rows and a second plurality of columns, a first subset of the second plurality of diodes being electrically coupled between the first node and the second node in a reverse direction, a second subset of the second plurality of diodes being electrically decoupled between the first node and the second node, each diode of the second plurality of diodes comprising:
    - a third semiconductor strip having the first conductivity type; and
    - a fourth semiconductor strip having the second conductivity type, wherein a first diode of adjacent diodes in each column of the second plurality of columns has a corresponding third semiconductor strip aligned with a corresponding fourth semiconductor strip of a second diode of the adjacent diodes along a third direction, wherein the first diode of adjacent diodes in each column of the second plurality of columns has a corresponding fourth semiconductor strip aligned with a corresponding third semiconductor strip of the second diode of the adjacent diodes along a fourth direction parallel to the third direction, and wherein a number of diodes electrically coupled between the first node and the second node in at least one column of the second plurality of columns is less than a number of the second plurality of rows.

7. The ESD protection device of claim 6, wherein different rows of the second plurality of rows have different numbers of diodes of the first subset of the second plurality of diodes electrically coupled to each other.

8. The ESD protection device of claim 6, wherein different columns of the second plurality of columns have different numbers of diodes of the first subset of the second plurality of diodes electrically coupled to each other.

9. An Electro-Static Discharge (ESD) protection device comprising:
- a plurality of unit devices electrically coupled in parallel between a first node and a second node, each unit device comprising:
  - one or more Silicon-Controlled Rectifier (SCR)/diode-string combination units coupled in parallel between the first node and the second node, each SCR/diode-string combination unit comprising:
    - a first region in a first semiconductor strip, the first region having a first conductivity type;
    - a second region in the first semiconductor strip, the second region having a second conductivity type, the second conductivity type being opposite the first conductivity type, the first region and the second region being in a first well region, the first well region having the second conductivity type, a first junction between the first region and the second region forming a first diode;
    - a third region in a second semiconductor strip, the third region having the second conductivity type;
    - a fourth region in the second semiconductor strip, the fourth region having the first conductivity type, the third region and the fourth region being in a second well region, the second well region having the second conductivity type, the first well region and the second well region being physically separated, a second junction between the third region and the fourth region forming a second diode, wherein the first diode and the second diode are two of a plurality of diodes arraigned in a single column and a plurality of rows, and wherein a number of diodes of the plurality of diodes electrically coupled between the first node and the second node are less than a number of the plurality of rows; and
a first conductor electrically connecting the second region to the fourth region; and
one or more diode-string-free SCR units coupled in parallel between the first node and the second node, each diode-string-free SCR unit comprising:
a fifth region and a sixth region in the first semiconductor strip, the fifth region and the sixth region having the first conductivity type, the fifth region and the sixth region being in the first well region; and
a seventh region and an eighth region in the second semiconductor strip, the seventh region and the eighth region having the second conductivity type, the seventh region and the eighth region being in the second well region.

10. The ESD protection device of claim 9, wherein each unit device further comprises one or more diode-string-free SCR units coupled in parallel between the first node and the second node, each diode-string-free SCR unit comprising:
a fifth region and a sixth region in the first semiconductor strip, the fifth region and the sixth region having the first conductivity type, the fifth region and the sixth region being in the first well region; and
a seventh region and an eighth region in the second semiconductor strip, the seventh region and the eighth region having the second conductivity type, the seventh region and the eighth region being in the second well region.

11. The ESD protection device of claim 9, wherein each unit device has a first number of the one or more SCR/diode-string combination units and a second number of the one or more diode-string-free SCR units, the first number being different from the second number.

12. The ESD protection device of claim 9, wherein each unit device has a first number of the SCR/diode-string combination units and a second number of the one or more diode-string-free SCR units, the first number being equal to the second number.

13. The ESD protection device of claim 9, wherein, within each unit device, a first SCR/diode-string combination unit of the one or more SCR/diode-string combination units is interposed between a first diode-string-free SCR unit and a second diode-string-free SCR unit of the one or more diode-string-free SCR units.

14. The ESD protection device of claim 9, wherein, within each unit device, a first diode-string-free SCR unit of the one or more diode-string-free SCR units is interposed between a first SCR/diode-string combination unit of the one or more SCR/diode-string combination units and a second diode-string-free SCR unit of the one or more diode-string-free SCR units.

15. The ESD protection device of claim 9, wherein, within each unit device, a first diode-string-free SCR unit of the one or more diode-string-free SCR units is interposed between a second diode-string-free SCR unit and a third diode-string-free SCR unit of the one or more diode-string-free SCR units.

16. An Electro-Static Discharge (ESD) protection device comprising:
a substrate of a first conductivity type, the substrate having a first well region, a second well region and a third well region of a second conductivity type, and a fourth well region and a fifth well region of the second conductivity type within the third well region, the second conductivity type being different from the first conductivity type, the first well region, the second well region and the third well region being physically separated from each other, the fourth well region and the fifth well region being physically separated from each other;
a first semiconductor strip extending over the first well region, the third well region and the fourth well region, the first semiconductor strip having a first region of the first conductivity type and a second region of the second conductivity type within the first well region, a first junction between the first region and the second region forming a first diode;
a second semiconductor strip extending over the second well region, the third well region and the fifth well region, the second semiconductor strip having a third region of the second conductivity type and a fourth region of the first conductivity type within the second well region, a second junction between the third region and the fourth region forming a second diode;
a first node electrically connected to the first region; and
a second node electrically connected to the third region, wherein the first diode and the second diode are two of a first plurality of diodes electrically coupled between the first node and the second node in a forward direction, the first plurality of diodes being arranged in a first plurality of rows and a first plurality of columns, a number of diodes of the first plurality of diodes in at least one row of the first plurality of rows being less than a number of the first plurality of columns.

17. The ESD protection device of claim 16, wherein the first conductivity type is a p-type, and wherein the second conductivity type is an n-type.

18. The ESD protection device of claim 16, wherein the first well region and the second well region are aligned along a first direction, and the fourth well region and the fifth well region are aligned along a second direction parallel to the first direction.

19. The ESD protection device of claim 16, wherein the first semiconductor strip further has a fifth region of the second conductivity type and a sixth region of the first conductivity type within the fourth well region, the fifth region being electrically connected to the first node, a third junction between the fifth region and the sixth region forming a third diode, wherein the second semiconductor strip further has a seventh region of the first conductivity type and an eighth region of the second conductivity type within the fifth well region, the seventh region being electrically connected to the second node, a fourth junction between the seventh region and the eighth region forming a fourth diode, and wherein the third diode and the fourth diode are two of a second plurality of diodes electrically coupled between the first node and the second node in a reverse direction, the second plurality of diodes being arranged in a second plurality of rows and a second plurality of columns, a number of diodes of the second plurality of diodes in at least one row of the second plurality of rows being less than a number of the second plurality of columns.

20. The ESD protection device of claim 16 further comprising:
a first gate stack on the first semiconductor strip between the first region and the second region;
a second gate stack on the first semiconductor strip between the third region and the fourth region;
a third gate stack on the second semiconductor strip between the fifth region and the sixth region; and a fourth gate stack on the second semiconductor strip between the seventh region and the eighth region.

\* \* \* \* \*

UNITED STATES PATENT AND TRADEMARK OFFICE
CERTIFICATE OF CORRECTION

PATENT NO. : 9,876,005 B2
APPLICATION NO. : 15/171812
DATED : January 23, 2018
INVENTOR(S) : Su It is certified that error appears in the above-identified patent and that said Letters Patent is hereby corrected as shown below:

In the Claims

Column 14, Lines 54-67 - Column 15, Lines 1-26, Claim 1 replace with the following:
1. An Electro-Static Discharge (ESD) protection device comprising:
  a first branch electrically coupled between a first node and a second node, the first branch comprising:
    a first plurality of well regions of a second conductivity type in a substrate of a first conductivity type, the second conductivity type being opposite the first conductivity type, the first plurality of well regions being arranged in a first plurality of rows, the first plurality of well regions being physically separated from each other; and
    a first plurality of diodes on the first plurality of well regions, the first plurality of diodes being arranged in the first plurality of rows and a first plurality of columns, a first subset of the first plurality of diodes being electrically coupled between the first node and the second node in a forward direction, a second subset of the first plurality of diodes being electrically decoupled between the first node and the second node,
  wherein a number of diodes electrically coupled between the first node and the second node in at least one column of the first plurality of columns is less than a number of the first plurality of rows.

Column 16, Lines 36-67 - Column 17, Lines 1-19, Claim 9 replace with the following:
9. An Electro-Static Discharge (ESD) protection device comprising:
  a plurality of unit devices electrically coupled in parallel between a first node and a second node, each unit device comprising:
    one or more Silicon-Controlled Rectifier (SCR)/diode-string combination units coupled in parallel between the first node and the second node, each SCR/diode-string combination unit comprising:
      a first region in a first semiconductor strip, the first region having a first conductivity type;
      a second region in the first semiconductor strip, the second region having a second conductivity type, the second conductivity type being opposite the first conductivity type, the Signed and Sealed this
Tenth Day of April, 2018

Andrei Iancu
*Director of the United States Patent and Trademark Office*

CERTIFICATE OF CORRECTION (continued)
U.S. Pat. No. 9,876,005 B2 first region and the second region being in a first well region, the first well region having the second conductivity type, a first junction between the first region and the second region forming a first diode;
        a third region in a second semiconductor strip, the third region having the second conductivity type; and
        a fourth region in the second semiconductor strip, the fourth region having the first conductivity type, the third region and the fourth region being in a second well region, the second well region having the second conductivity type, the first well region and the second well region being physically separated, a second junction between the third region and the fourth region forming a second diode, wherein the first diode and the second diode are two of a plurality of diodes arranged in a single column and a plurality of rows, and wherein a number of diodes of the plurality of diodes electrically coupled between the first node and the second node are less than a number of the plurality of rows.

Column 18, Lines 60-67 - Column 19, Lines 1-2, Claim 20 replace with the following:
20. The ESD protection device of claim 16 further comprising:
    a first gate stack on the first semiconductor strip between the first region and the second region;
    a second gate stack on the first semiconductor strip between the fifth region and the sixth region;
    a third gate stack on the second semiconductor strip between the third region and the fourth region; and
    a fourth gate stack on the second semiconductor strip between the seventh region and the eighth region.